US011882701B2

(12) United States Patent
Baek

(10) Patent No.: US 11,882,701 B2
(45) Date of Patent: Jan. 23, 2024

(54) SEMICONDUCTOR DEVICE INCLUDING MULTI-STACK STRUCTURE

(71) Applicant: Samsung Electronics Co., Ltd., Suwon-si (KR)

(72) Inventor: Seok Cheon Baek, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 125 days.

(21) Appl. No.: 17/333,407

(22) Filed: May 28, 2021

(65) Prior Publication Data

US 2021/0288072 A1 Sep. 16, 2021

Related U.S. Application Data

(63) Continuation of application No. 16/365,827, filed on Mar. 27, 2019, now Pat. No. 11,056,502.

(30) Foreign Application Priority Data

Sep. 19, 2018 (KR) ......................... 10-2018-0112039

(51) Int. Cl.
*H10B 43/27* (2023.01)
*H01L 29/66* (2006.01)
*H10B 43/30* (2023.01)
*H10B 43/40* (2023.01)
*H10B 43/50* (2023.01)

(52) U.S. Cl.
CPC ....... *H10B 43/27* (2023.02); *H01L 29/66833* (2013.01); *H10B 43/30* (2023.02); *H10B 43/40* (2023.02); *H10B 43/50* (2023.02)

(58) Field of Classification Search
CPC ........... H01L 27/1573; H01L 27/11568; H01L 27/11575; H01L 27/11582; H01L 29/66833; H01L 23/5386; H10B 43/27; H10B 43/30; H10B 43/40; H10B 43/50
See application file for complete search history.

(56) References Cited

U.S. PATENT DOCUMENTS

| 8,587,052 | B2 | 11/2013 | Yun et al. |
| 8,633,104 | B2 | 1/2014 | Pyo et al. |
| 9,263,368 | B2 | 2/2016 | Oh et al. |
| 9,698,151 | B2 * | 7/2017 | Lee ......................... H10B 43/50 |

(Continued)

FOREIGN PATENT DOCUMENTS

KR 10-2017-0046892 A 5/2017

*Primary Examiner* — Ratisha Mehta
(74) *Attorney, Agent, or Firm* — Harness, Dickey & Pierce, P.L.C.

(57) ABSTRACT

A semiconductor device includes a substrate having a cell region and a connection region adjacent to the cell region. A lower stack structure and an upper stack structure are disposed on the substrate. A channel structure is provided to pass through the upper stack structure and the lower stack structure. A distance between a lower extension line portion included in an uppermost one of a plurality of lower interconnection layers and an upper extension line portion included in a lowermost one of a plurality of upper interconnection layers is less than a distance between a lower gate electrode portion included in the uppermost one of the plurality of lower interconnection layers and an upper gate electrode portion included in the lowermost one of the plurality of upper interconnection layers.

14 Claims, 30 Drawing Sheets

(56) References Cited

U.S. PATENT DOCUMENTS

| | | |
|---|---|---|
| 9,748,257 B2 | 8/2017 | Lee et al. |
| 9,754,963 B1 | 9/2017 | Kawamura et al. |
| 9,865,540 B2 | 1/2018 | Kim et al. |
| 10,629,675 B1 | 4/2020 | Nishikawa et al. |
| 2007/0262301 A1 | 11/2007 | Cowburn et al. |
| 2016/0225714 A1* | 8/2016 | Yun ........................ H10B 43/27 |
| 2017/0200678 A1 | 7/2017 | Zhang et al. |
| 2017/0271347 A1* | 9/2017 | Fukuzumi ................ H01L 28/00 |
| 2018/0083025 A1 | 3/2018 | Inatsuka et al. |
| 2018/0138194 A1 | 5/2018 | Shigemura et al. |
| 2018/0301407 A1* | 10/2018 | Yeh ................... H01L 27/11565 |
| 2019/0139974 A1 | 5/2019 | Sugawara et al. |
| 2019/0252396 A1* | 8/2019 | Mushiga ................ H10B 41/10 |
| 2020/0075629 A1 | 3/2020 | Park et al. |

* cited by examiner

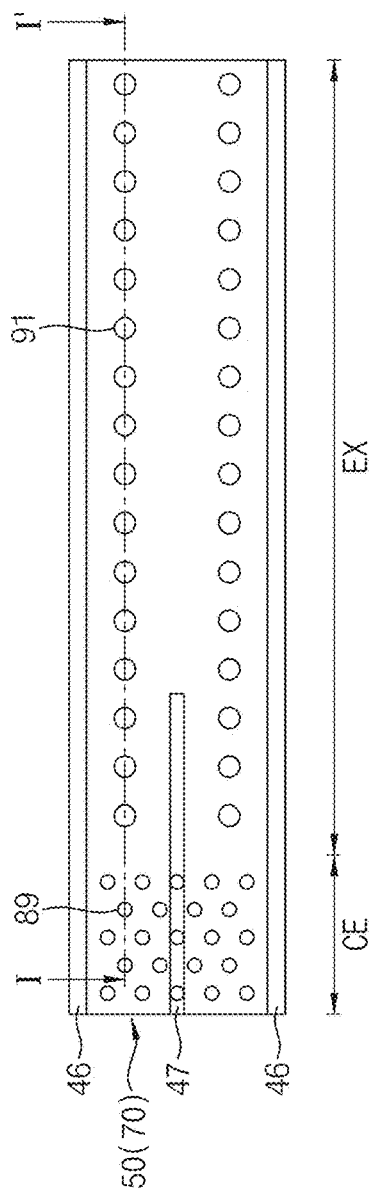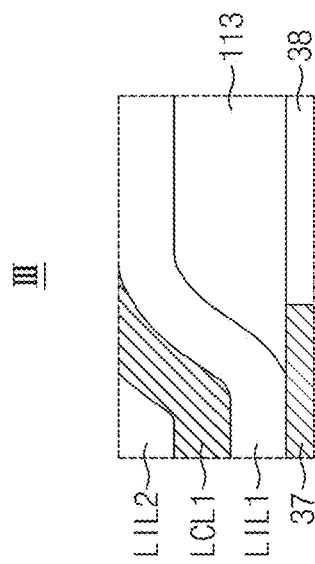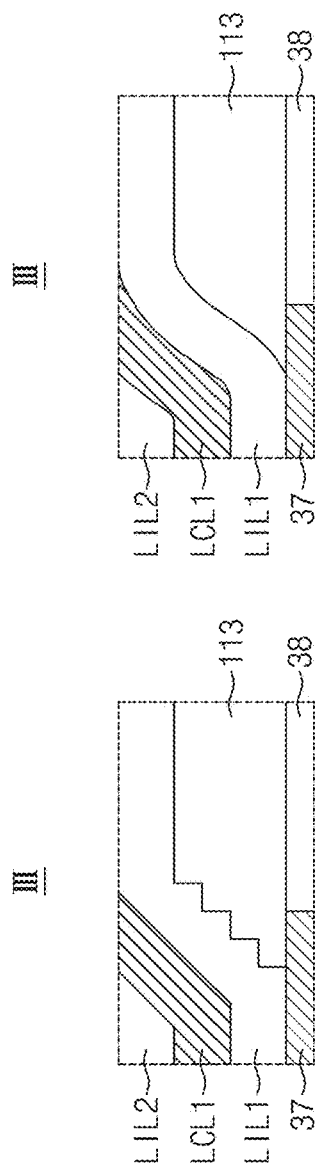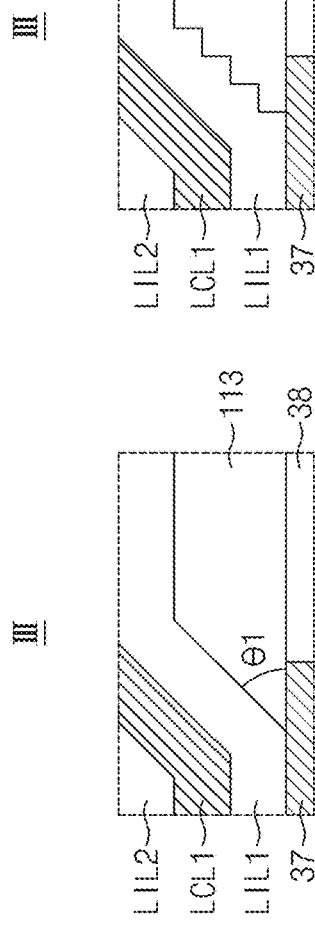

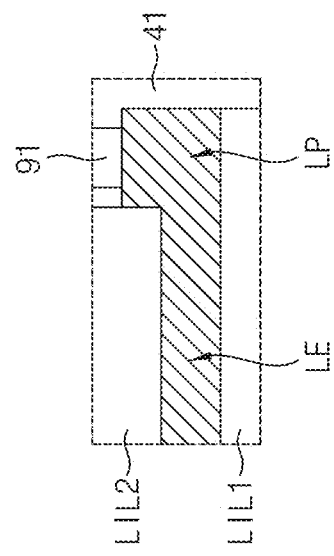
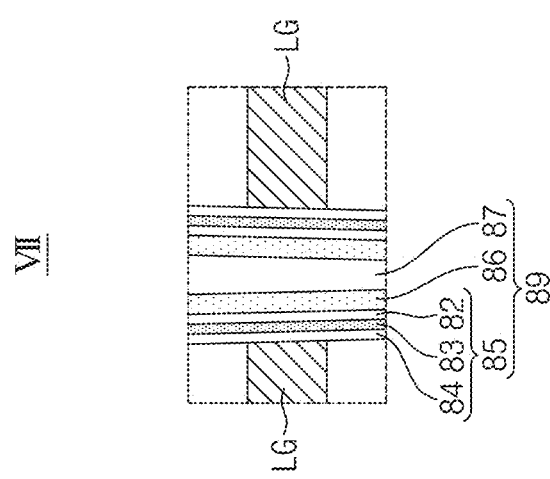
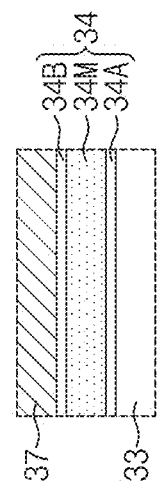

SEMICONDUCTOR DEVICE INCLUDING MULTI-STACK STRUCTURE

CROSS-REFERENCE TO RELATED APPLICATION

This U.S. non-provisional patent application is a continuation of U.S. application Ser. No. 16/365,827, filed on Mar. 27, 2019, which claims priority under 35 U.S.C. § 119 to Korean Patent Application No. 10-2018-0112039, filed on Sep. 19, 2018, in the Korean Intellectual Property Office (KIPO), the disclosure of each of which is incorporated herein by reference in its entirety.

BACKGROUND

1. Field

Example embodiments of the inventive concepts relate to relate to semiconductor devices having a multi-stack structure and/or methods of forming the same.

2. Description of Related Art

A technique using a multi-stack structure has been used to increase an integration density of semiconductor devices. A channel structure may be disposed to pass through the multi-stack structure. The multi-stack structure may include a plurality of insulating layers and a plurality of interconnection layers that are alternately stacked on each other. Each of the plurality of interconnection layers may include a pad portion. Due to an increase in the number of the plurality of interconnection layers that are vertically stacked, a process of forming the pad portion is becoming complicated and difficult.

SUMMARY

Some example embodiments of the inventive concepts are directed to providing semiconductor devices, which provide an increase in integration density and has improved electrical characteristics, and/or methods of forming the same.

According to an example embodiment, a semiconductor device may include a substrate having a cell region and a connection region adjacent to the cell region, a lower stack structure including a plurality of lower insulating layers and a plurality of lower interconnection layers, the plurality of lower insulating layers and the plurality of lower interconnection layers being alternately stacked on each other on the substrate, each of the plurality of lower interconnection layers including a lower gate electrode portion in the cell region and a lower extension line portion in the connection region, the lower extension line portion extending from the lower gate electrode portion, an upper stack structure including a plurality of upper insulating layers and a plurality of upper interconnection layers, the plurality of upper insulating layers and the plurality of upper interconnection layers being alternately stacked on each other on the lower stack structure, each of the plurality of upper interconnection layers including an upper gate electrode portion in the cell region and an upper extension line portion in the connection region, the upper extension line portion extending from the upper gate electrode portion, and a channel structure passing through the upper stack structure and the lower stack structure. A first distance between the lower extension line portion included in an uppermost one of the plurality of lower interconnection layers and the upper extension line portion included in a lowermost one of the plurality of upper interconnection layers may be less than a second distance between the lower gate electrode portion included in the uppermost one of the plurality of lower interconnection layers and the upper gate electrode portion included in the lowermost one of the plurality of upper interconnection layers.

According to an example embodiment, a semiconductor device may include a substrate having a cell region and a connection region adjacent to the cell region, a lower stack structure including a plurality of lower insulating layers and a plurality of lower interconnection layers alternately stacked on each other on the substrate, each of the plurality of lower interconnection layers including a lower electrode portion in the cell region and a lower extension line portion in the connection region, the lower extension line portion extending from the lower electrode portion, an upper stack structure including a plurality of upper insulating layers and a plurality of upper interconnection layers alternately stacked on each other on the lower stack structure, each of the plurality of upper interconnection layers including, an upper electrode portion in the cell region and an upper extension line portion in the connection region, the upper extension line portion extending from the upper electrode portion, and a channel structure passing through the upper stack structure and the lower stack structure. At least one of the lower extension line portion of an uppermost one of the plurality of lower interconnection layers or the upper extension line portion of the lowermost one of the plurality of upper interconnection layers may include a first inclined region near the cell region.

According to an example embodiment, a semiconductor device may include a substrate having a cell region and a connection region adjacent to the cell region, a plurality of extension lines in the connection region, the plurality of extension lines sequentially stacked on the substrate, a plurality of gate electrodes in the cell region, the plurality of gate electrodes sequentially stacked on the substrate, the plurality of gate electrodes connected to corresponding ones of the plurality of extension lines, respectively, to form a plurality of interconnection layers, a plurality of insulating layers being alternatively between the plurality of interconnection layers, first distances between pairs of two neighboring ones of the plurality of extension lines are substantially equal to each other, and at least one of distances between pairs of two neighboring ones of the plurality of gate electrodes is greater than the first distances, and a channel structure passing through the plurality of gate electrodes.

According to an example embodiment, a semiconductor device may include a substrate having a cell region and a connection region adjacent to the cell region, a lower stack structure including a plurality of lower insulating layers and a plurality of lower interconnection layers, the plurality of lower insulating layers and the plurality of lower interconnection layers alternately stacked on each other on the substrate, each of the plurality of lower interconnection layers including a lower gate electrode portion in the cell region and a lower extension line portion in the connection region and extending from the lower gate electrode portion, an upper stack structure including a plurality of upper insulating layers and a plurality of upper interconnection layers, the plurality of upper insulating layers and the plurality of upper interconnection layers alternately stacked on each other on the lower stack structure, each of the plurality of upper interconnection layers including an upper gate electrode portion in the cell region and an upper extension line portion in the connection region and extending from the upper gate electrode portion, a channel structure passing through the upper stack structure and the lower stack structure, and at least one middle spacer structure in the connection region, the middle spacer structure including a dummy interconnection layer, the dummy interconnection layer including at least one dummy extension line portion, the at least one dummy extension line portion being between the upper stack structure and the lower stack structure, the middle spacer structure being in contact with a side surface of at least one of the plurality of lower insulating layers or the plurality of upper insulating layers, a first distance between lower extension line portions of two neighboring ones of the plurality of lower interconnection layers, a thickness of the dummy extension line portion, and a second distance between upper extension line portions of two neighboring ones of the plurality of upper interconnection layers are substantially equal to each other.

BRIEF DESCRIPTION OF THE DRAWINGS

FIG. 2 is a plan view layout illustrating a semiconductor device according to an example embodiment of the inventive concepts.

FIGS. 3 to 8 are partial enlarged views of corresponding portions of FIG. 1.

DETAILED DESCRIPTION

While the term "same" or "equal" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially (equal or same)" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Figure 1:
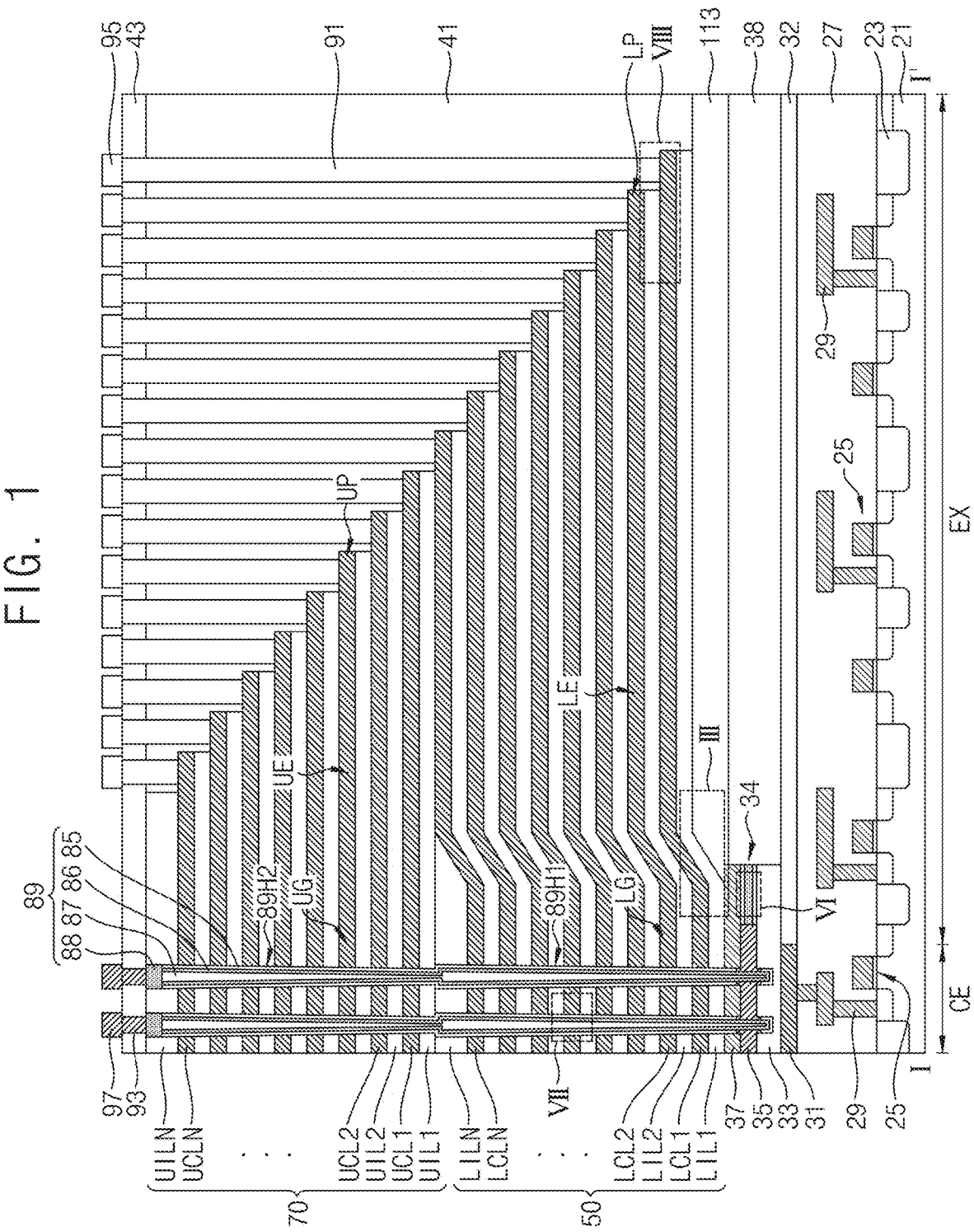
FIG. 1 is a cross-sectional view illustrating a semiconductor device according to an example embodiment of the inventive concepts.

FIG. 1 is a cross-sectional view illustrating a semiconductor device according to an example embodiment of the inventive concepts. FIG. 2 is a plan view layout illustrating a semiconductor device according to an example embodiment of the inventive concepts. FIG. 1 may be a cross-sectional view taken along line I-I' of FIG. 2. FIGS. 3 to 8 are partial enlarged views of corresponding portions of FIG. 1. The semiconductor device according to some example embodiments of the inventive concepts may include a nonvolatile memory (e.g., a vertical NAND (VNAND) or three-dimensional (3D) flash memory). The semiconductor device according to the some example embodiments of the inventive concepts may adopt a cell-on-peripheral (COP) structure.

Referring to FIG. 1, the semiconductor device according to the an example embodiment may include a substrate 21, a device isolation layer 23, a plurality of transistors 25, a first insulating layer 27, a plurality of peripheral circuit interconnections 29, a lower buried conductive layer 31, a second insulating layer 32, a middle buried conductive layer 33, a source mold layer 34, a replacement conductive line 35, a support plate 37, a third insulating layer 38, a fourth insulating layer 41, a fifth insulating layer 43, a lower stack structure 50, an upper stack structure 70, a plurality of lower channel holes 89H1, a plurality of upper channel holes 89H2, a plurality of channel structures 89, a plurality of cell contact plugs 91, a plurality of bit plugs 93, a plurality of upper circuit interconnections 95, a plurality of bit lines 97, and lower spacers 113.

The substrate 21 may include a cell region CE and a connection region EX adjacent to the cell region CE. The connection region EX may be continuous with the cell region CE. The lower stack structure 50 may include a plurality of lower insulating layers LIL1, LIL2, and LILN and a plurality of lower interconnection layers LCL1, LCL2, and LCLN, which are alternately stacked on each other. Each of the plurality of lower interconnection layers LCL1, LCL2, and LCLN may include a lower gate electrode portion LG, a lower extension line portion LE, and a lower pad portion LP. The lower extension line portion LE may be connected between the lower gate electrode portion LG and the lower pad portion LP. The upper stack structure 70 may include a plurality of upper insulating layers UIL1, UIL2, and UILN and a plurality of upper interconnection layers UCL1, UCL2, and UCLN, which are alternately stacked on each other. Each of the plurality of upper interconnection layers UCL1, UCL2, and UCLN may include an upper gate electrode portion UG, an upper extension line portion UE, and an upper pad portion UP. The upper extension line portion UE may be connected between the upper gate electrode portion UG and the upper pad portion UP. Each of the plurality of channel structures 89 may include an information storage pattern 85, a channel pattern 86, a core pattern 87, and a bit pad 88.

In an example embodiment, the replacement conductive line 35 may correspond to a common source line (CSL). Some of the plurality of lower interconnection layers LCL1, LCL2, and LCLN, which are adjacent to a bottom end of the lower stack structure 50, may correspond to gate-induced drain leakage (GIDL) control lines, ground selection lines (GSLs), or source selection lines (SSLs). Some of the plurality of lower interconnection layers LCL1, LCL2, and LCLN and the plurality of upper interconnection layers UCL1, UCL2, and UCLN may correspond to word lines.

Some of the plurality of upper interconnection layers UCL1, UCL2, and UCLN, which are adjacent to a top end of the upper stack structure 70, may correspond to GIDL control lines, string selection lines (SSLs), or drain selection lines (DSLs).

Referring to FIG. 2, the semiconductor device according to an example embodiment may include a cell region CE, a connection region EX, a plurality of isolation trenches 46, a selection line isolation pattern 47, a lower stack structure 50, an upper stack structure 70, a plurality of channel structures 89, and a plurality of cell contact plugs 91.

The lower stack structure 50 and the upper stack structure 70 may be defined between the plurality of isolation trenches 46. The selection line isolation pattern 47 may be disposed between the plurality of isolation trenches 46. The selection line isolation pattern 47 may cross the cell region CE and extend into the connection region EX. In an example embodiment, the plurality of isolation trenches 46 may serve as word line cut patterns.

FIG. 3 is a partial enlarged view of a portion III of FIG. 1. Referring to FIG. 3, the lower spacer 113 may include an inclined side surface formed adjacent to a boundary between the cell region CE and the connection region EX. A straight line passing through an upper end (e.g., a top end or an upper corner) and a lower end (e.g., a lower corner) of the lower spacer 113 may form a first inclination angle θ1 with respect to a horizontal line in parallel with a surface of the substrate 21. The first inclination angle θ1 may be 60° or less (e.g., an angle between 1° to 60°). For example, the first inclination angle θ1 may be about 45°.

FIG. 4 is a partial enlarged view of the portion III of FIG. 1. Referring to FIG. 4, the side surface of the lower spacer 113 may be formed to have a staircase shape.

FIG. 5 is a partial enlarged view of the portion III of FIG. 1. Referring to FIG. 5, the side surface of the lower spacer 113 may be formed to have a gently curved surface, which includes one or more inflection points.

FIG. 6 is a partial enlarged view of the portion VI of FIG. 1. Referring to FIG. 6, the source mold layer 34 may include a lower source mold layer 34A, a middle source mold layer 34M, and an upper source mold layer 34C, which are sequentially stacked. In an example embodiment, the lower source mold layer 34A may include silicon oxide, the middle source mold layer 34M may include silicon nitride, and the upper source mold layer 34C may include silicon oxide.

FIG. 7 is a partial enlarged view of the portion VII of FIG. 1. Referring to FIG. 7, the information storage pattern 85 may include a tunnel insulating layer 82, a charge storage layer 83, and a blocking layer 84. The blocking layer 84 may surround the outside of the charge storage layer 83. The blocking layer 84 may be a single layer or a multilayered structure. The core pattern 87 may be an insulating layer (e.g., silicon oxide) or a semiconductor layer (e.g., polysilicon). The channel pattern 86 may include a semiconductor layer (e.g., polysilicon). The tunnel insulating layer 82 may include an insulating layer (e.g., silicon oxide). The charge storage layer 83 may include silicon nitride. The blocking layer 84 may include silicon oxide, a metal oxide, or a combination thereof.

FIG. 8 is a partial enlarged view of the portion VIII of FIG. 1. Referring to FIG. 8, the lower pad portion LP, which is continuous with (or extended from) one end of the lower extension line portion LE, may include the same conductive material as the lower extension line portion LE. As shown in FIG. 8, in some example embodiments, a thickness of the lower pad portion LP may be relatively greater than that of the lower extension line portion LE. Bottom surfaces of the lower pad portion LP and the lower extension line portion LE may be substantially coplanar with each other. The upper extension line portion UE and the upper pad portion UP may exhibit shapes similar to those of the lower extension line portion LE and the lower pad portion LP. Each of a top surface of the lower pad portion LP and a top surface of the upper pad portion UP may be above each of a top surface of the lower extension line portion LE and a top surface of the upper extension line portion, thereby forming respective raised pads.

Referring back to FIGS. 1 to 8, the substrate 21 may include a semiconductor substrate (e.g., a silicon wafer). The device isolation layer 23 may include an insulating layer formed using a shallow trench isolation (STI) process. The device isolation layer 23 may include silicon oxide, silicon nitride, silicon oxynitride, silicon oxycarbonitride (SiOCN), or a combination thereof. The plurality of transistors 25 may include a fin-type field-effect transistor (finFET), a multi-bridge channel transistor, a nanowire transistor, a vertical transistor, a recess channel transistor, a 3D transistor, a planar transistor, or a combination thereof. The plurality of peripheral circuit interconnections 29 may include horizontal interconnections and vertical interconnections having various shapes. The plurality of peripheral circuit interconnections 29 may include a metal, a metal nitride, a metal oxide, a metal silicide, polysilicon, conductive carbon, or a combination thereof. The plurality of peripheral circuit interconnections 29 may be connected to the plurality of transistors 25.

The first insulating layer 27 may cover the device isolation layer 23, the plurality of transistors 25, and the plurality of peripheral circuit interconnections 29. Each of the first insulating layer 27, the second insulating layer 32, the third insulating layer 38, the fourth insulating layer 41, and the fifth insulating layer 43 may include silicon oxide, silicon nitride, silicon oxynitride, silicon oxycarbonitride (SiOCN), a low-k dielectric material, a high-k dielectric material, or a combination thereof.

The lower buried conductive layer 31 may be disposed in the cell region CE. The second insulating layer 32 may be disposed in the connection region EX. The lower buried conductive layer 31 and the second insulating layer 32 may be provided on a same plane. The lower buried conductive layer 31 may be electrically connected to at least a corresponding one of the plurality of peripheral circuit interconnections 29. The lower buried conductive layer 31 may include a metal, a metal nitride, a metal oxide, a metal silicide, polysilicon, conductive carbon, or a combination thereof.

The middle buried conductive layer 33 may be formed on the lower buried conductive layer 31. The middle buried conductive layer 33 may include a semiconductor layer (e.g., polysilicon including N-type impurities). The replacement conductive line 35 and the source mold layer 34 may be disposed on the middle buried conductive layer 33. The replacement conductive line 35 may include a metal, a metal nitride, a metal oxide, a metal silicide, polysilicon, conductive carbon, or a combination thereof. In an example embodiment, the replacement conductive line 35 may include a semiconductor layer (e.g., polysilicon including N-type impurities). The replacement conductive line 35 may pass through the information storage pattern 85 and be in direct contact with a side surface of the channel pattern 86. The support plate 37 may be disposed on the replacement conductive line 35 and the source mold layer 34. The support plate 37 may include a semiconductor layer (e.g., polysilicon).

The third insulating layer 38 may be formed on the second insulating layer 32. The support plate 37 may cover the cell region CE and partially extend to the connection region EX. The third insulating layer 38 may be disposed in the connection region EX. Top surfaces of the third insulating layer 38 and the support plate 37 may be substantially coplanar with each other.

The lower spacer 113 may be disposed on the substrate 21 in the connection region EX. In an example embodiment, the lower spacer 113 may be disposed between the lower stack structure 50 and the third insulating layer 38. The lower spacer 113 may partially extend between the lower stack structure 50 and the support plate 37. The lower spacer 113 may exhibit various profiles as described with reference to FIGS. 3 to 5. The plurality of lower interconnection layers LCL1, LCL2, and LCLN may be formed to have relatively uniform thicknesses due to the inclined side surface of the lower spacer 113.

The lower stack structure 50 may be disposed on the support plate 37 and the lower spacer 113. A lowermost layer LIL1 of the plurality of lower insulating layers LIL1, LIL2, and LILN may be in direct contact with the support plate 37 and the lower spacer 113. The lower gate electrode portions LG may be disposed in the cell region CE. The lower pad portions LP may be disposed in the connection region EX. The lower extension line portions LE may be disposed in the connection region EX between the lower gate electrode portions LG and the lower pad portions LP. The lower extension line portions LE and the lower pad portions LP may overlap the lower spacer 113.

Each of the lower extension line portions LE may be disposed at a higher level than a corresponding one of the lower gate electrode portions LG. A bottom surface of each of the lower extension line portions LE may be disposed at a higher level than a bottom surface of the corresponding one of the lower gate electrode portions LG. A bottom surface of each of the lower pad portions LP may be disposed at substantially the same level as the bottom surface of the corresponding one of the lower extension line portions LE.

An uppermost layer LILN of the plurality of lower insulating layers LIL1, LIL2, and LILN may be disposed in the cell region CE and partially extend in the connection region EX. A top surface of the uppermost layer LILN of the plurality of lower insulating layers LIL1, LIL2, and LILN may be substantially coplanar with a top surface of the lower extension line portion LE included in an uppermost layer LCLN of the plurality of lower interconnection layers LCL1, LCL2, and LCLN.

The upper stack structure 70 may be disposed on the lower stack structure 50. A lowermost layer UIL1 of the plurality of upper insulating layers UIL1, UIL2, and UILN may be in direct contact with the uppermost layer LILN of the plurality of lower insulating layers LIL1, LIL2, and LILN and the uppermost layer LCLN of the plurality of lower interconnection layers LCL1, LCL2, and LCLN. The lowermost layer UIL1 of the plurality of upper insulating layers UIL1, UIL2, and UILN may be in direct contact with the top surface of the lower extension line portion LE included in the uppermost layer LCLN of the plurality of lower interconnection layers LCL1, LCL2, and LCLN.

The upper gate electrode portions UG may be disposed in the cell region CE. The upper pad portions UP may be disposed in the connection region EX. The upper extension line portions UE may be disposed in the connection region EX between the upper gate electrode portions UG and the upper pad portions UP. Each of the upper extension line portions UE may be disposed at the same level as a corresponding one of the upper gate electrode portions UG. A bottom surface of each of the upper pad portions UP may be disposed at the same level as the bottom surface of the corresponding one of the upper extension line portions UE.

The lower pad portions LP and the upper pad portions UP may be offset-aligned with each other in the connection region EX. The lower pad portions LP and the upper pad portions UP may exhibit a staircase form. The fourth insulating layer 41 may cover the lower pad portions LP and the upper pad portions UP.

In the cell region CE, the plurality of lower channel holes 89H1 may be disposed to pass through the lower stack structure 50, the support plate 37, and the replacement conductive line 35. In the cell region CE, the plurality of upper channel holes 89H2 may be disposed to pass through the upper stack structure 70 and communicatively coupled to or connected with the plurality of lower channel holes 89H1. The plurality of channel structures 89 may be formed inside the plurality of lower channel holes 89H1 and the plurality of upper channel holes 89H2.

Boundaries between the plurality of lower channel holes 89H1 and the plurality of upper channel holes 89H2 may be substantially coplanar with a boundary between the lower stack structure 50 and the upper stack structure 70. A boundary between the lower extension line portion LE included in the uppermost layer LCLN of the plurality of lower interconnection layers LCL1, LCL2, and LCLN and the lowermost layer UIL1 of the plurality of upper insulating layers UIL1, UIL2, and UILN, a boundary between the uppermost layer LILN of the plurality of lower insulating layers LIL1, LIL2, and LILN and the lowermost layer UIL1 of the plurality of upper insulating layers UIL1, UIL2, and UILN, and the boundaries between the plurality of lower channel holes 89H1 and the plurality of upper channel holes 89H2 may be substantially coplanar with each other.

The fifth insulating layer 43 may be disposed on the upper stack structure 70 and the fourth insulating layer 41. The plurality of cell contact plugs 91 may be disposed to pass through the fifth insulating layer 43 and the fourth insulating layer 41 and be in contact with the lower pad portions LP and the upper pad portions UP. The plurality of bit plugs 93 may be disposed to pass through the fifth insulating layer 43 and be in contact with the bit pads 88. The plurality of upper circuit interconnections 95 and the plurality of bit lines 97 may be formed on the fifth insulating layer 43. The plurality of upper circuit interconnections 95 may be in contact with the plurality of cell contact plugs 91. The plurality of bit lines 97 may be in contact with the plurality of bit plugs 93. Each of the plurality of lower interconnection layers LCL1, LCL2, and LCLN, the plurality of upper interconnection layers UCL1, UCL2, and UCLN, the plurality of cell contact plugs 91, the plurality of bit plugs 93, the plurality of upper circuit interconnections 95, and the plurality of bit lines 97 may include a conductive layer (e.g., a metal, a metal silicide, a metal nitride, a metal oxide, conductive carbon, polysilicon, or a combination thereof).

The uppermost layer LILN of the plurality of lower insulating layers LIL1, LIL2, and LILN may be thicker than each of other layers LIL1 and LIL2. In the cell region CE, a distance between the uppermost layer LCLN of the plurality of lower interconnection layers LCL1, LCL2, and LCLN and a lowermost layer UCL1 of the plurality of upper interconnection layers UCL1, UCL2, and UCLN may be greater than each of distances between the plurality of lower interconnection layers LCL1, LCL2, and LCLN and each of distances between the plurality of upper interconnection layers UCL1, UCL2, and UCLN. In the connection region EX, each of the distances between the plurality of lower interconnection layers LCL1, LCL2, and LCLN, each of the distances between the plurality of upper interconnection layers UCL1, UCL2, and UCLN, and a distance between the uppermost layer LCLN of the plurality of lower interconnection layers LCL1, LCL2, and LCLN and the lowermost layer UCL1 of the plurality of upper interconnection layers UCL1, UCL2, and UCLN may be equal to each other.

In an example embodiment, a distance between the lower extension line portion LE included in the uppermost layer LCLN of the plurality of lower interconnection layers LCL1, LCL2, and LCLN and the upper extension line portion UE included in the lowermost layer UCL1 of the plurality of upper interconnection layers UCL1, UCL2, and UCLN may be less than a distance between the lower gate electrode portion LG included in the uppermost layer LCLN of the plurality of lower interconnection layers LCL1, LCL2, and LCLN and the upper gate electrode portion UG included in the lowermost layer UCL1 of the plurality of upper interconnection layers UCL1, UCL2, and UCLN. Each of distances between the lower extension line portions LE, each of distances between the upper extension line portions UE, and the distance between the lower extension line portion LE included in the uppermost layer LCLN of the plurality of lower interconnection layers LCL1, LCL2, and LCLN and the upper extension line portion UE included in the lowermost layer UCL1 of the plurality of upper interconnection layers UCL1, UCL2, and UCLN may be substantially equal to each other.

In an example embodiment, a distance between the upper gate electrode portions UG may be substantially equal to a distance between the lower gate electrode portions LG. A distance between the lower gate electrode portion LG included in the uppermost layer LCLN of the plurality of lower interconnection layers LCL1, LCL2, and LCLN and the upper gate electrode portion UG included in the lowermost layer UCL1 of the plurality of upper interconnection layers UCL1, UCL2, and UCLN may be greater than the distance between the lower gate electrode portions LG.

In an example embodiment, the plurality of lower insulating layers LIL1, LIL2, and LILN and the plurality of upper insulating layers UIL1, UIL2, and UILN may be interpreted as a plurality of insulating layers LIL1, LIL2, LILN, UIL1, UIL2, and UILN. The plurality of lower interconnection layers LCL1, LCL2, and LCLN and the plurality of upper interconnection layers UCL1, UCL2, and UCLN may be interpreted as a plurality of interconnection layers LCL1, LCL2, LCLN, UCL1, UCL2, and UCLN. The lower gate electrode portions LG and the upper gate electrode portions UG may be interpreted as a plurality of gate electrode portions LG and UG. The lower extension line portions LE and the upper extension line portions UE may be interpreted as a plurality of extension line portions LE and UE. The lower pad portions LP and the upper pad portions UP may be interpreted as a plurality of pad portions LP and UP.

The plurality of channel structures 89 may pass through the plurality of insulating layers LIL1, LIL2, LILN, UIL1, UIL2, and UILN and the plurality of gate electrodes LG and UG. Distances between the plurality of extension line portions LE and UE may be substantially equal to each other. At least one of the distances between the plurality of gate electrode portions LG and UG may be greater than each of the distances between the plurality of extension line portions LE and UE. At least one of the plurality of insulating layers LIL1, LIL2, LILN, UIL1, UIL2, and UILN, which may be adjacent to a boundary between the lower channel hole 89H1 and the upper channel hole 89H2, may have a thickness greater than the distance between the plurality of extension line portions LE and UE.

FIGS. 9 to 15 are cross-sectional views of semiconductor devices taken along line I-I' of FIG. 2, illustrating a semiconductor device according to some example embodiments of the inventive concepts.

Figure 9:
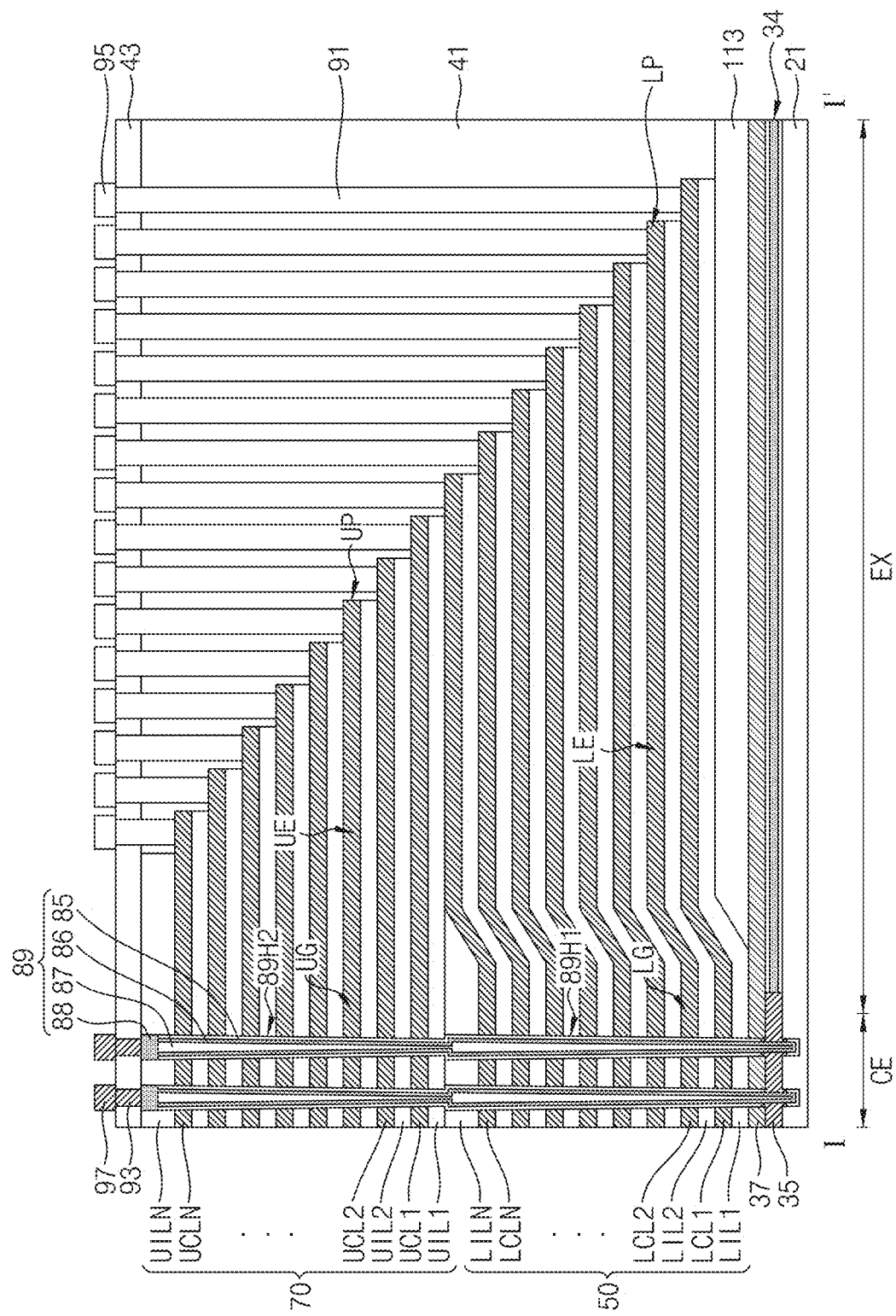
FIGS. 9 to 15 are cross-sectional views illustrating semiconductor devices according to some example embodiments of the inventive concepts.

Referring to FIG. 9, a source mold layer 34 and a replacement conductive line 35 may be disposed on a substrate 21. A support plate 37 may be disposed on the source mold layer 34 and the replacement conductive line 35. A plurality of channel structures 89 may pass through an upper stack structure 70, a lower stack structure 50, the support plate 37, and the replacement conductive line 35.

Figure 10:
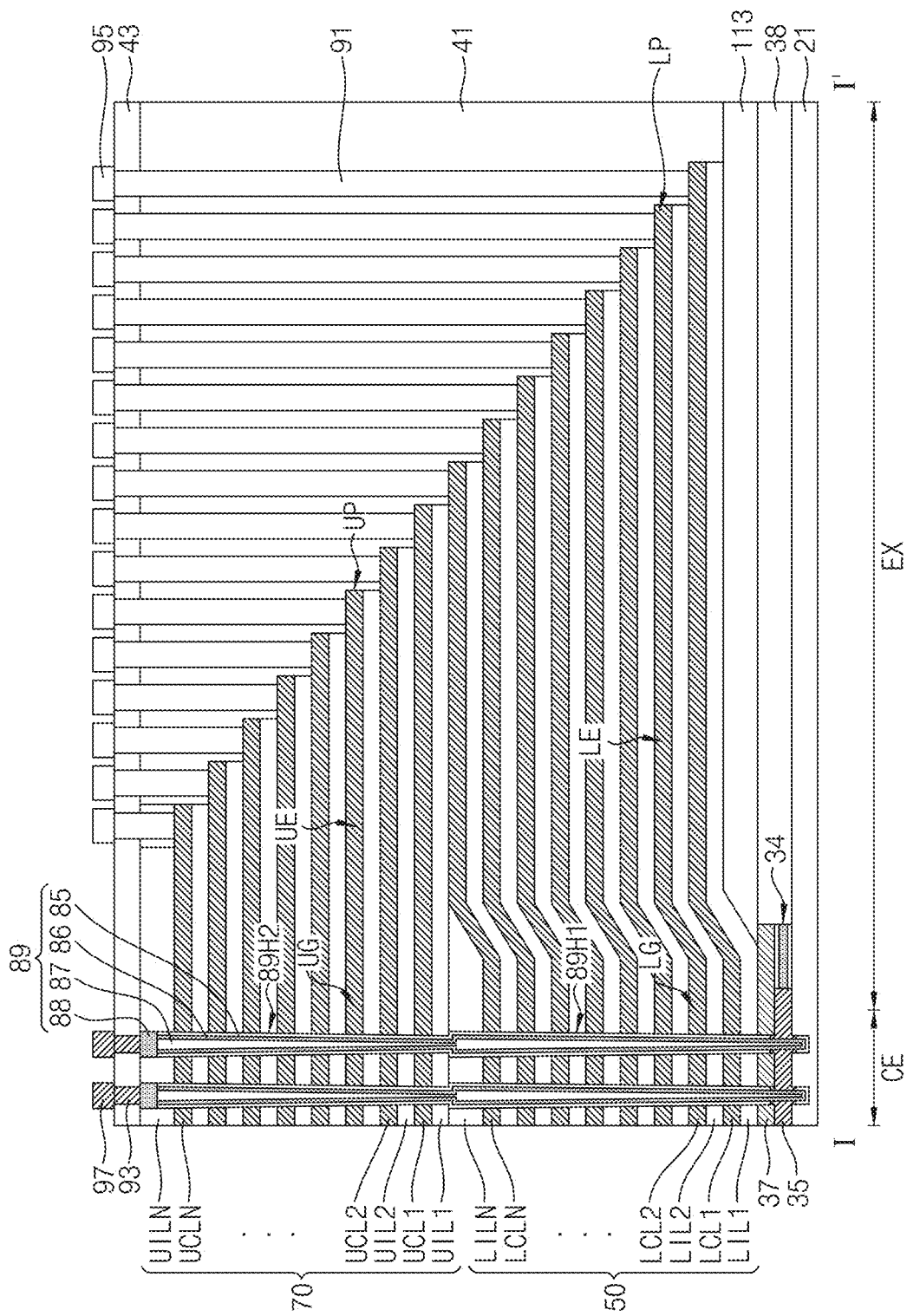

Referring to FIG. 10, a source mold layer 34, a replacement conductive line 35, and a third insulating layer 38 may be disposed on the substrate 21. A support plate 37 may be disposed on the source mold layer 34 and the replacement conductive line 35. Side surfaces of the support plate 37 and the source mold layer 34 may be in contact with a side surface of the third insulating layer 38.

Figure 11:
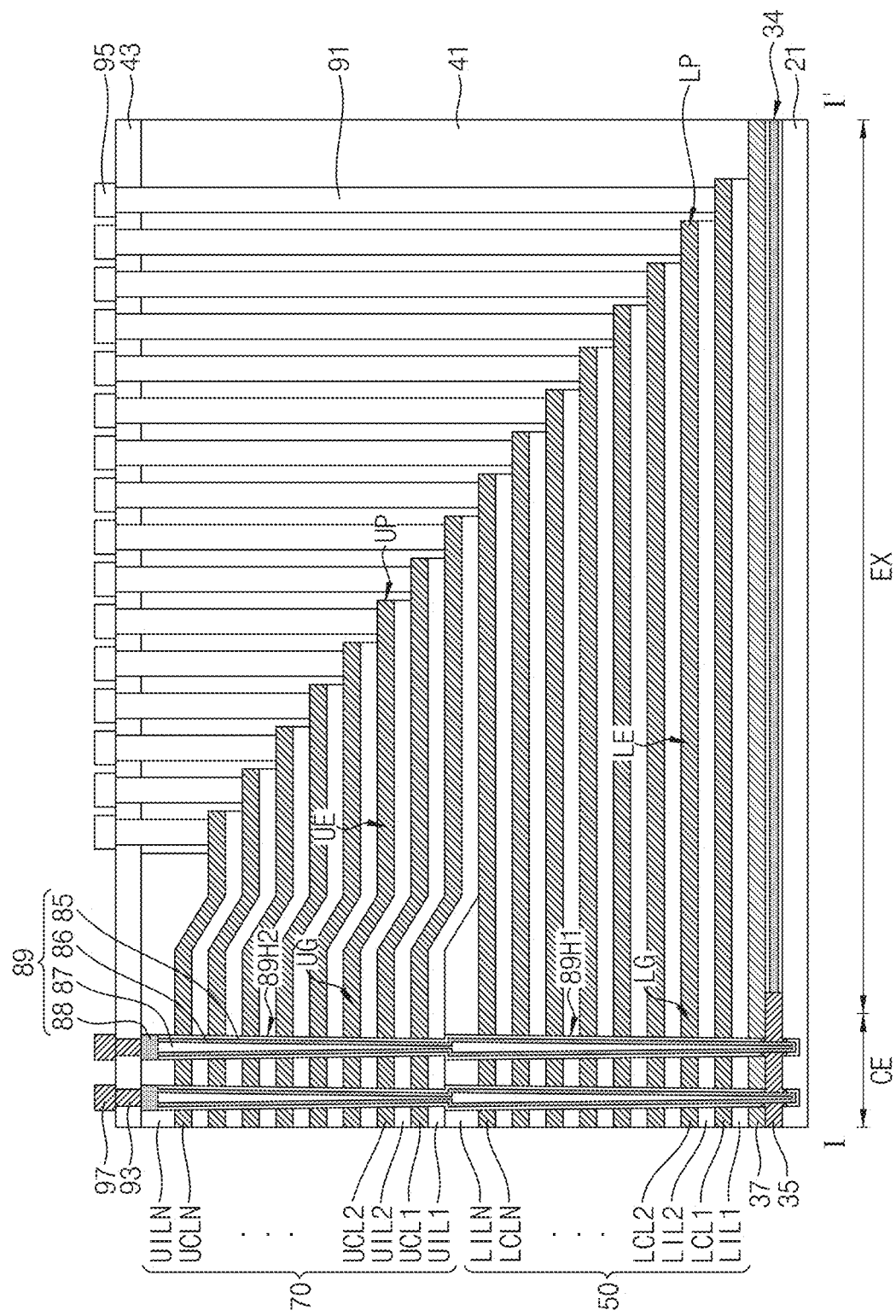

Referring to FIG. 11, a thickness of an uppermost layer LILN of a plurality of lower insulating layers LIL1, LIL2, and LILN may be relatively greater than a thickness of each of other layers LIL1 and LIL2 other than the uppermost layer LILN of the plurality of lower insulating layers LIL1, LIL2, and LILN. The uppermost layer LILN of the plurality of lower insulating layers LIL1, LIL2, and LILN may partially cover an uppermost layer LCLN of the plurality of lower interconnection layers LCL1, LCL2, and LCLN. Bottom surfaces of a lower gate electrode portion LG, a lower extension line portion LE, and a lower pad portion LP may be substantially coplanar with each other.

The uppermost layer LILN of the plurality of lower insulating layers LIL1, LIL2, and LILN may cover the lower gate electrode portion LG and partially extend on the lower extension line portion LE. The uppermost layer LILN of the plurality of lower insulating layers LIL1, LIL2, and LILN may include an inclined side surface adjacent to a boundary between a cell region CE and a connection region EX. The inclined side surface of the uppermost layer LILN of the plurality of lower insulating layers LIL1, LIL2, and LILN may have a profile similar to that of the lower spacer 113 described with reference to FIGS. 3 to 5.

A lowermost layer UIL1 of a plurality of upper insulating layers UIL1, UIL2, and UILN may be in direct contact with the uppermost layer LILN of the plurality of lower insulating layers LIL1, LIL2, and LILN and the uppermost layer LCLN of the plurality of lower interconnection layers LCL1, LCL2, and LCLN. The lower extension line portion LE of the uppermost layer LCLN of the plurality of lower interconnection layers LCL1, LCL2, and LCLN may be in direct contact with the lowermost layer UIL1 of the plurality of upper insulating layers UIL1, UIL2, and UILN.

Bottom surfaces of an upper extension line portion UE and an upper pad portion UP may be disposed at a lower level than a bottom surface of an upper gate electrode portion UG. A distance between the lower extension line portions LE, a distance between the upper extension line portions UE, and a distance between the lower extension line portion LE included in the uppermost layer LCLN of the plurality of lower interconnection layers LCL1, LCL2, and LCLN and the upper extension line portion UE included in the lowermost layer UCL1 of the plurality of upper interconnection layers UCL1, UCL2, and UCLN may be substantially equal to each other.

Figure 12:
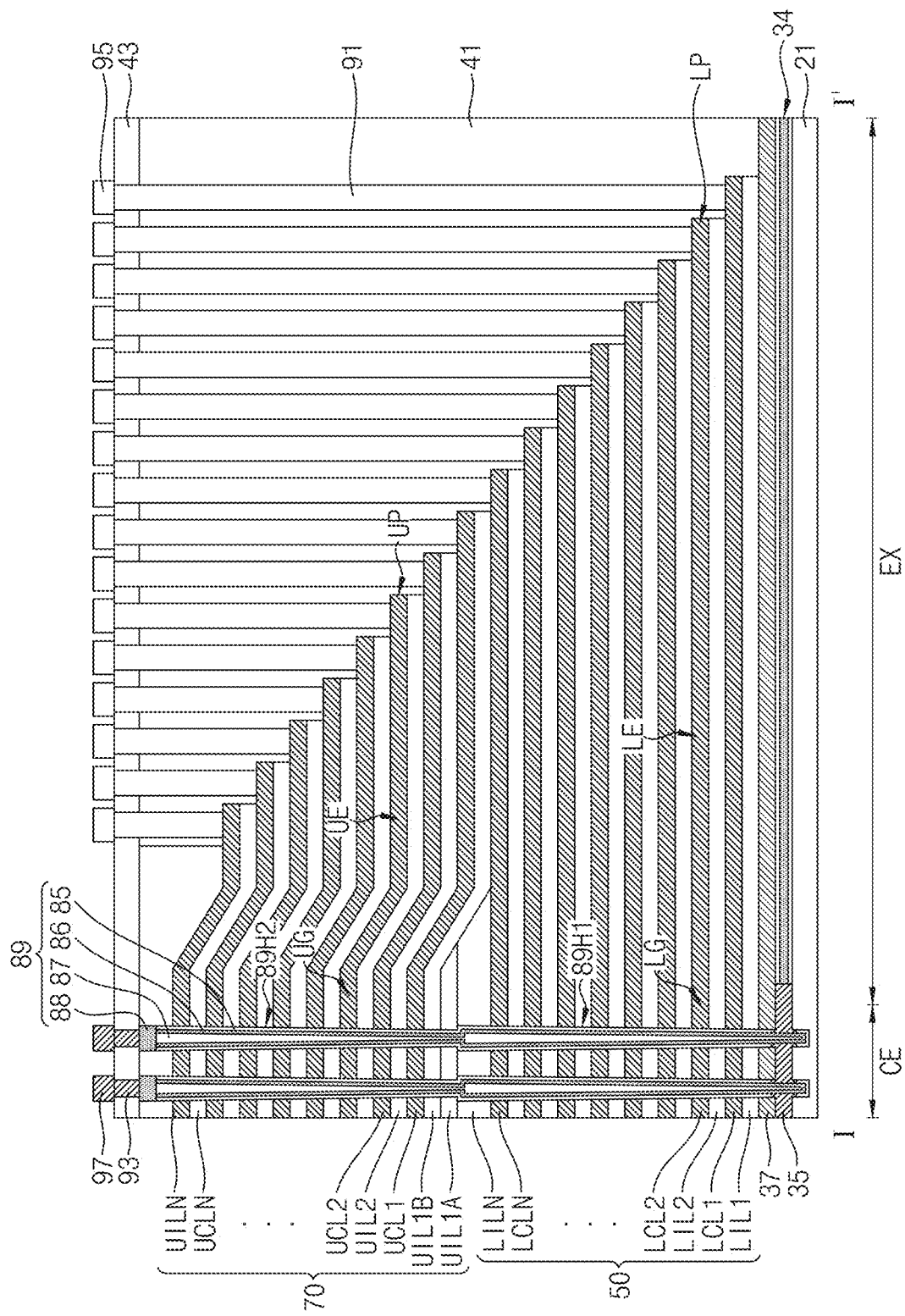

Referring to FIG. 12, a plurality of upper insulating layers UIL1A, UIL1B, UIL2, and UILN may include a first layer UIL1A and a second layer UIL1B. The first layer UIL1A and the second layer UIL1B may constitute a lowermost layer of the plurality of upper insulating layers UIL1A, UIL1B, UIL2, and UILN. The first layer UIL1A may be disposed on the uppermost layer LILN of the plurality of lower insulating layers LIL1, LIL2, and LILN. The first layer UIL1A may be disposed between the lower gate electrode portion LG and the upper gate electrode portion UG. The second layer UIL1B may cover the first layer UIL1A and extend to the connection region EX. A thickness of the second layer UIL1B may be substantially equal to the distance between the lower extension line portions LE. The bottom surfaces of the upper extension line portion UE and the upper pad portion UP may be disposed at a lower level than the bottom surface of the upper gate electrode portion UG.

Figure 13:
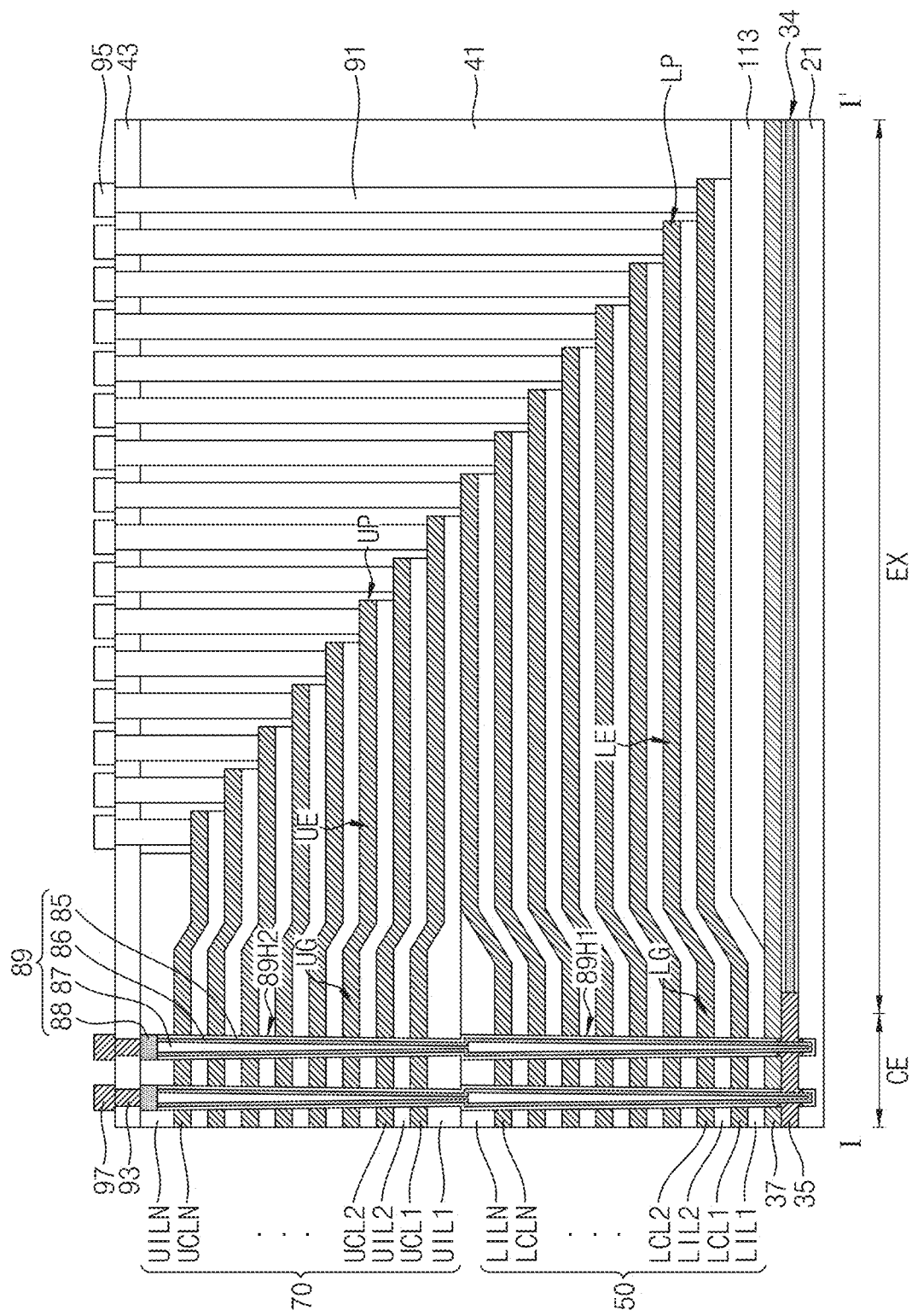

Referring to FIG. 13, the lowermost layer UIL1 of the plurality of upper insulating layers UIL1, UIL2, and UILN may be relatively thick between the lower gate electrode portion LG and the upper gate electrode portion UG and relatively thin between the lower extension line portion LE and the upper extension line portion UE. The bottom surfaces of the upper extension line portion UE and the upper pad portion UP may be disposed at a lower level than the bottom surface of the upper gate electrode portion UG.

Figure 14:
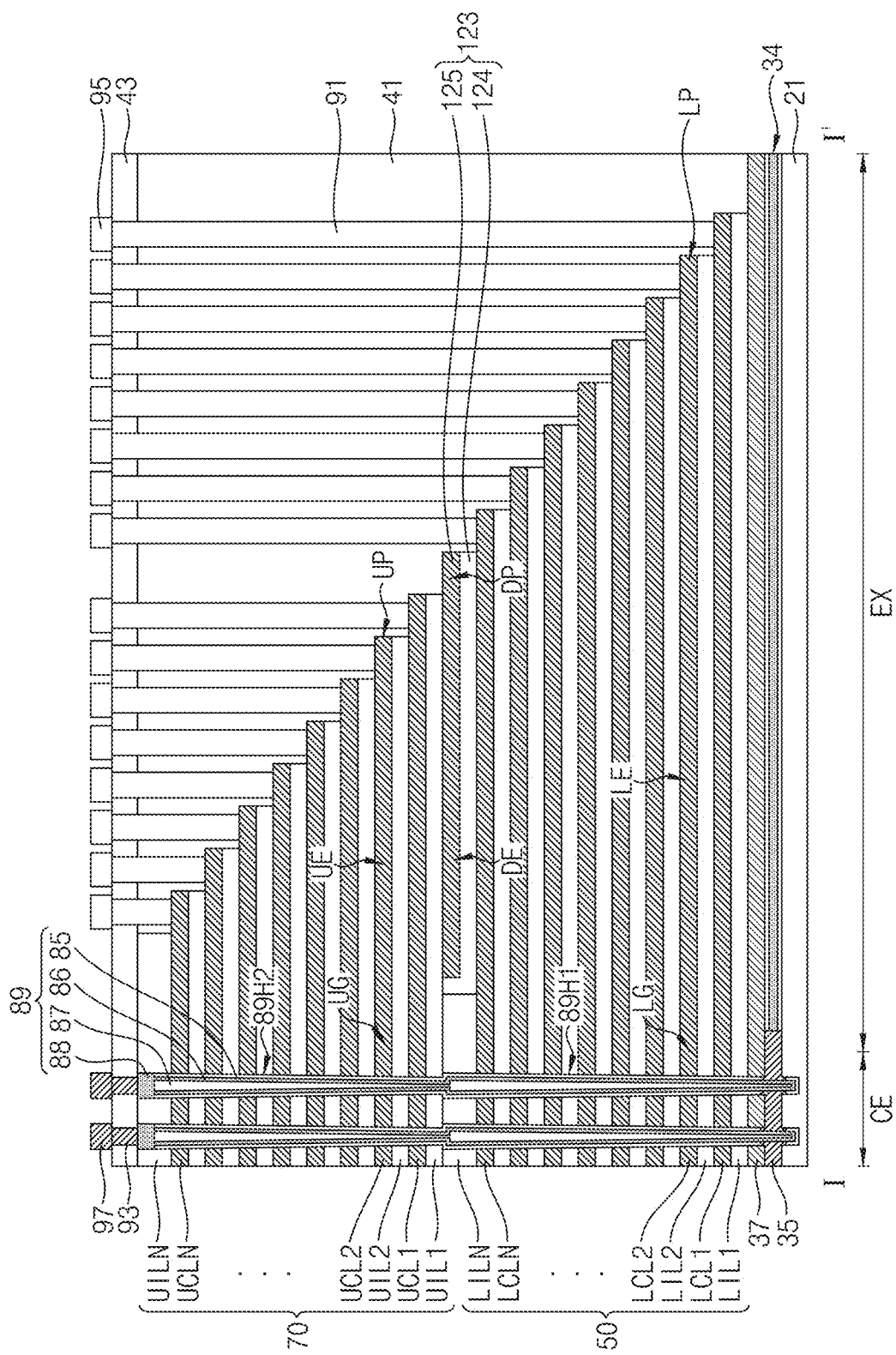

Referring to FIG. 14, a first middle spacer structure 123 may be disposed in the connection region EX between the lower stack structure 50 and the upper stack structure 70. The first middle spacer structure 123 may include a first dummy insulating layer 124 and a first dummy interconnection layer 125 disposed on the first dummy insulating layer 124. The first dummy interconnection layer 125 may include a dummy extension line portion DE and a dummy pad portion DP connected to the dummy extension line portion DE.

The uppermost layer LILN of the plurality of lower insulating layers LIL1, LIL2, and LILN may cover the cell region CE and partially extend into the connection region EX. The first middle spacer structure 123 may be in contact with a side surface of the uppermost layer LILN of the plurality of lower insulating layers LIL1, LIL2, and LILN. A top surface of the uppermost layer LILN of the plurality of lower insulating layers LIL1, LIL2, and LILN may be substantially coplanar with top surfaces of the dummy extension line portion DE and the first dummy insulating layer 124. A distance between respective two neighboring ones of the lower extension line portions LE, a thickness of the dummy extension line DE, and a distance of respective two neighboring ones of the upper extension line portions UE may be substantially equal to each other.

A distance between the lower gate electrode portion LG included in the uppermost layer LCLN of the plurality of lower interconnection layers LCL1, LCL2, and LCLN and the uppermost gate electrode UG included in the lowermost layer UCL1 of the plurality of upper interconnection layers UCL1, UCL2, and UCLN may be greater than the distance between of a neighboring pair of the lower extension line portions LE. The first dummy insulating layer 124 may be disposed between the lower extension line portion LE included in the uppermost layer LCLN of the plurality of lower interconnection layers LCL1, LCL2, and LCLN and the dummy extension line portion DE. A thickness of the first dummy insulating layer 124 may be substantially equal to the distance between a neighboring pair of the lower extension line portions LE.

Figure 15:
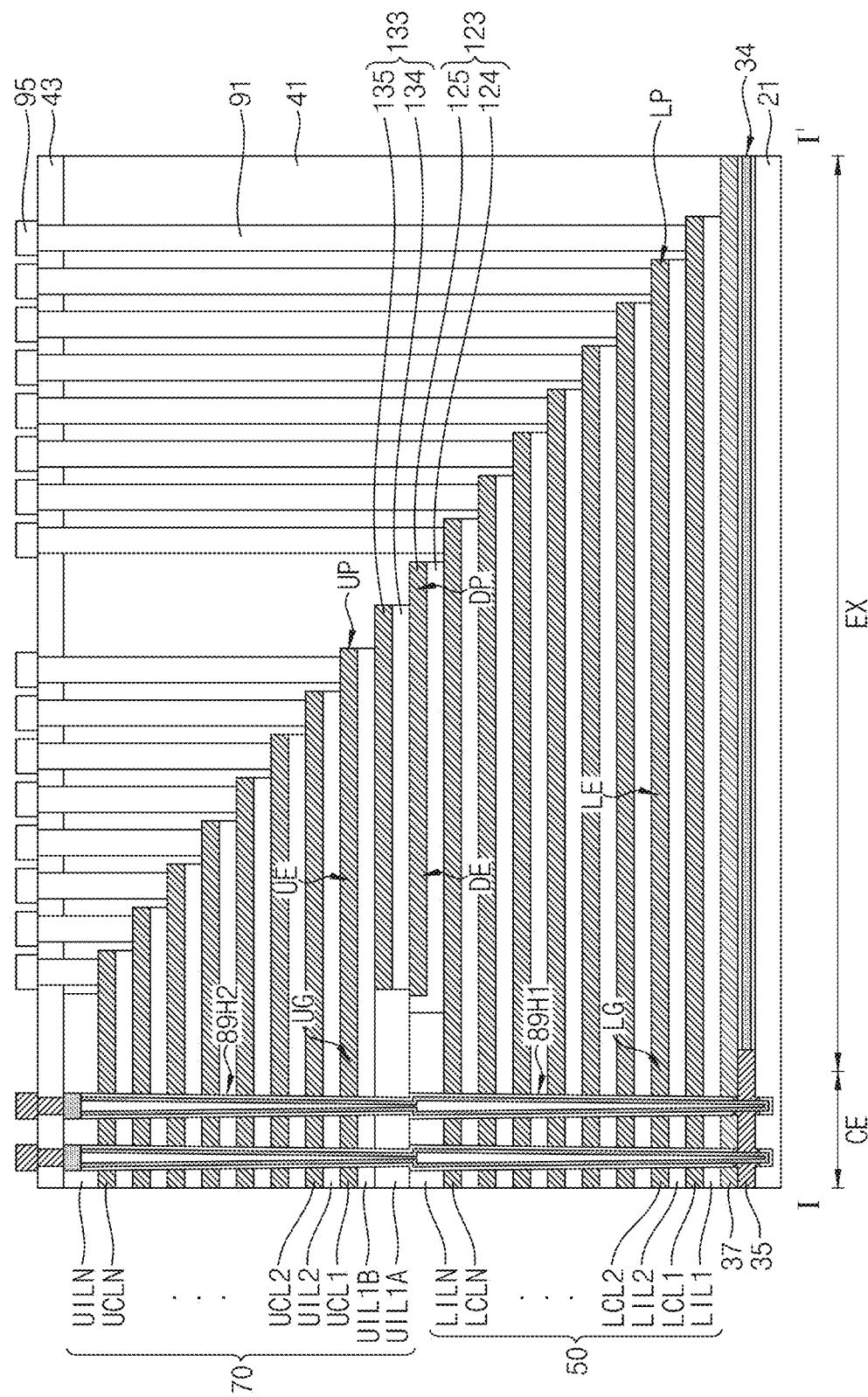

Referring to FIG. 15, the plurality of upper insulating layers UIL1A, UIL1B, UIL2, and UILN may include the first layer UIL1A and the second layer UIL1B. The first middle spacer structure 123 may be disposed in the connection region EX between the lower stack structure 50 and the upper stack structure 70, and a second middle spacer structure 133 may be disposed on the first middle spacer structure 123. The second middle spacer structure 133 may include a second dummy insulating layer 134 and a second dummy interconnection layer 135 disposed on the second dummy insulating layer 134. Each of the first dummy interconnection layer 125 and the second dummy interconnection layer 135 may include a dummy extension line portion DE and a dummy pad portion DP connected to the dummy extension line portion DE. A thickness of each of the first dummy insulating layer 124 and the second dummy insulating layer 134 may be substantially equal to the distances between a neighboring pair of the lower extension line portions LE.

FIGS. 16 to 18 and 25 to 31 are cross-sectional views taken along line I-I' of FIG. 2, illustrating methods of forming a semiconductor device according to an embodiment of the inventive concepts. FIGS. 19 to 24 are partial views of a portion of FIG. 18 to explain in detail the process illustrated in FIG. 18.

Figure 16:
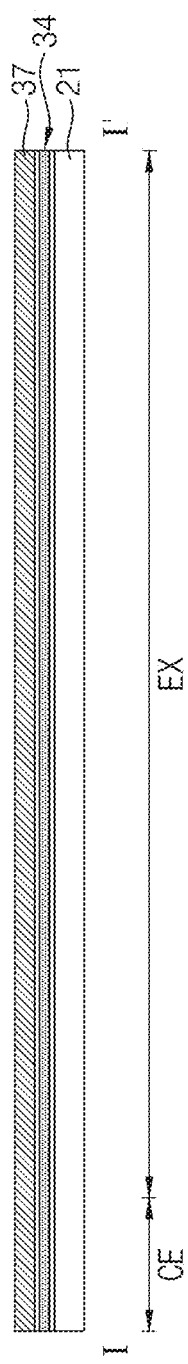
FIGS. 16 to 18 and 25 to 42 are cross-sectional views illustrating a method of forming a semiconductor device according to an example embodiment of the inventive concepts.

Referring to FIG. 16, a source mold layer 34 and a support plate 37 may be sequentially formed on a substrate 21 having a cell region CE and a connection region EX. The source mold layer 34 may include a plurality of layers described above with reference to FIG. 6. The support plate 37 may cover the source mold layer 34.

Figure 17:
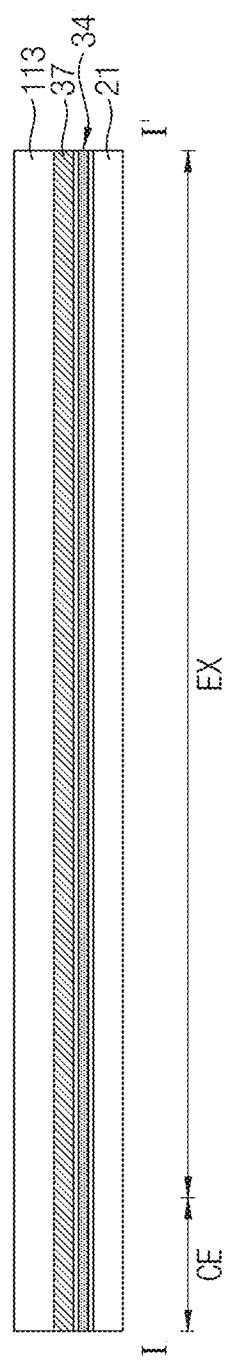

Referring to FIG. 17, a lower spacer 113 may be formed on the support plate 37. The lower spacer 113 may include a single layer or a multilayered structure.

Figure 18:
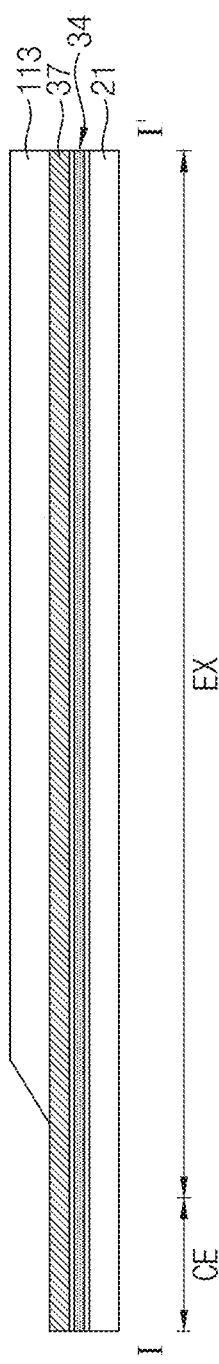

Referring to FIG. 18, the lower spacer 113 may be partially removed using a patterning process to expose the support plate 37 in the cell region CE. The lower spacer 113 may remain in the connection region EX.

Figure 19:
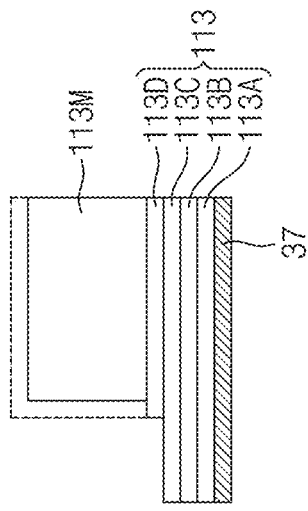
FIGS. 19 to 24 are partial views of a portion of FIG. 18 for explaining in detail the process illustrated FIG. 18.

Referring to FIG. 19, the lower spacer 113 may include a plurality of lower spacer layers 113A, 113B, 113C, and 113D. Each of the plurality of lower spacer layers 113A, 113B, 113C, and 113D may include an insulating layer (e.g., silicon oxide, silicon nitride, and silicon oxynitride), a semiconductor layer (e.g., polysilicon), a conductive layer (e.g., a metal, a metal nitride, and a metal oxide), or a combination thereof. In an example embodiment, the lower spacer 113 may include a first lower spacer layer 113A, a second lower spacer layer 113B, a third lower spacer layer 113C, and a fourth lower spacer layer 113D, which are sequentially stacked. A mask pattern 113M may be formed on the fourth lower spacer layer 113D. A top surface of the fourth lower spacer layer 113D may be partially exposed outside the mask pattern 113M.

Figure 20:
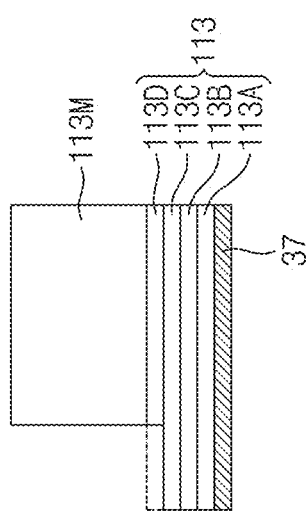

Referring to FIG. 20, the fourth lower spacer layer 113D may be etched using the mask pattern 113M as an etch mask, thereby partially exposing the third lower spacer layer 113C.

Figure 21:
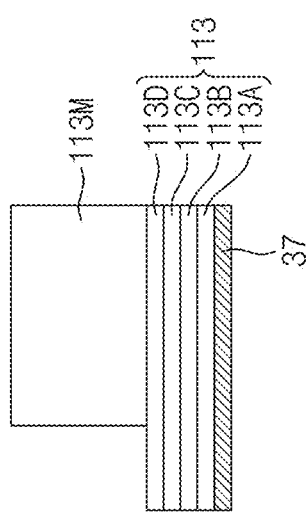

Referring to FIG. 21, the mask pattern 113M may be partially removed to partially expose the top surface of the fourth lower spacer layer 113D. The partial removal of the mask pattern 113M may be performed using a trimming process or a pullback process.

Figure 22:
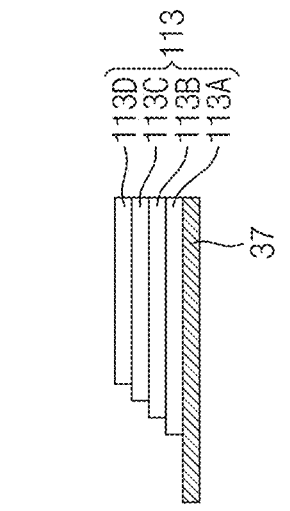

Referring to FIG. 22, the fourth lower spacer layer 113D and the third lower spacer layer 113C may be etched using the mask pattern 113M as an etch mask, thereby partially exposing the third lower spacer layer 113C and the second lower spacer layer 113B.

Figure 23:
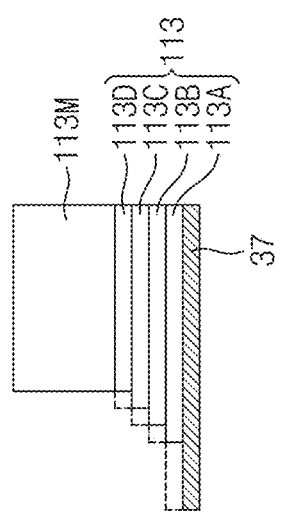

Referring to FIG. 23, the processes described with reference to FIGS. 20 to 22 may be repeated to partially expose a top surface of the support plate 37.

Figure 24:
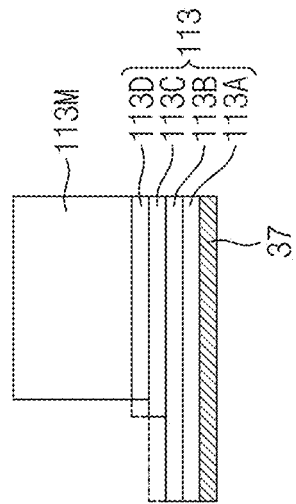

Referring to FIG. 24, the mask pattern 113M may be removed to expose the lower spacer 113. A side surface of the lower spacer 113 may have a staircase shape. In an example embodiment, the side surface of the lower spacer 113 may have various profiles shown in FIGS. 3 to 5.

Figure 25:
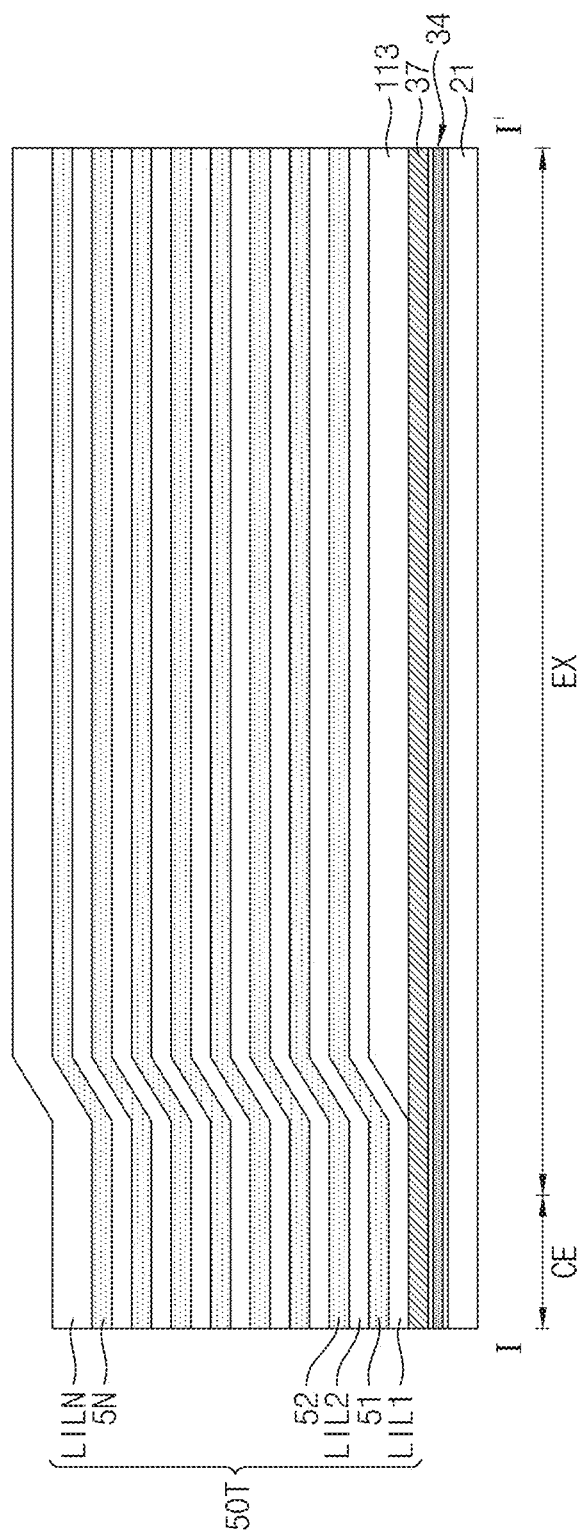

Referring to FIG. 25, a preliminary lower stack structure 50T may be formed on the substrate 21 having the lower spacer 113. The preliminary lower stack structure 50T may cover the cell region CE and the connection region EX. The preliminary lower stack structure 50T may include a plurality of lower insulating layers LIL1, LIL2, and LILN and a plurality of lower sacrificial layers 51, 52, and 5N, which are alternately stacked on each other.

The plurality of lower sacrificial layers 51, 52, and 5N may include a material having an etch selectivity with respect to the plurality of lower insulating layers LIL1, LIL2, and LILN. For example, the plurality of lower insulating layers LIL1, LIL2, and LILN may include oxide, such as silicon oxide, and the plurality of lower sacrificial layers 51, 52, and 5N may include nitride such as silicon nitride. A lowermost layer LIL1 of the preliminary lower stack structure 50T may be a lowermost layer LIL1 of the plurality of lower insulating layers LIL1, LIL2, and LILN, and an uppermost layer LILN of the preliminary lower stack structure 50T may be an uppermost layer LILN of the plurality of lower insulating layers LIL1, LIL2, and LILN. The lowermost layer LIL1 of the plurality of lower insulating layers LIL1, LIL2, and LILN may be in direct contact with the support plate 37 in the cell region CE, and may be in direct contact with the lower spacer 113 in the connection region EX. The uppermost layer LILN of the plurality of lower insulating layers LIL1, LIL2, and LILN may be thicker than each of other layers LIL1 and LIL2 of the plurality of lower insulating layers LIL1, LIL2, and LILN.

Figure 26:
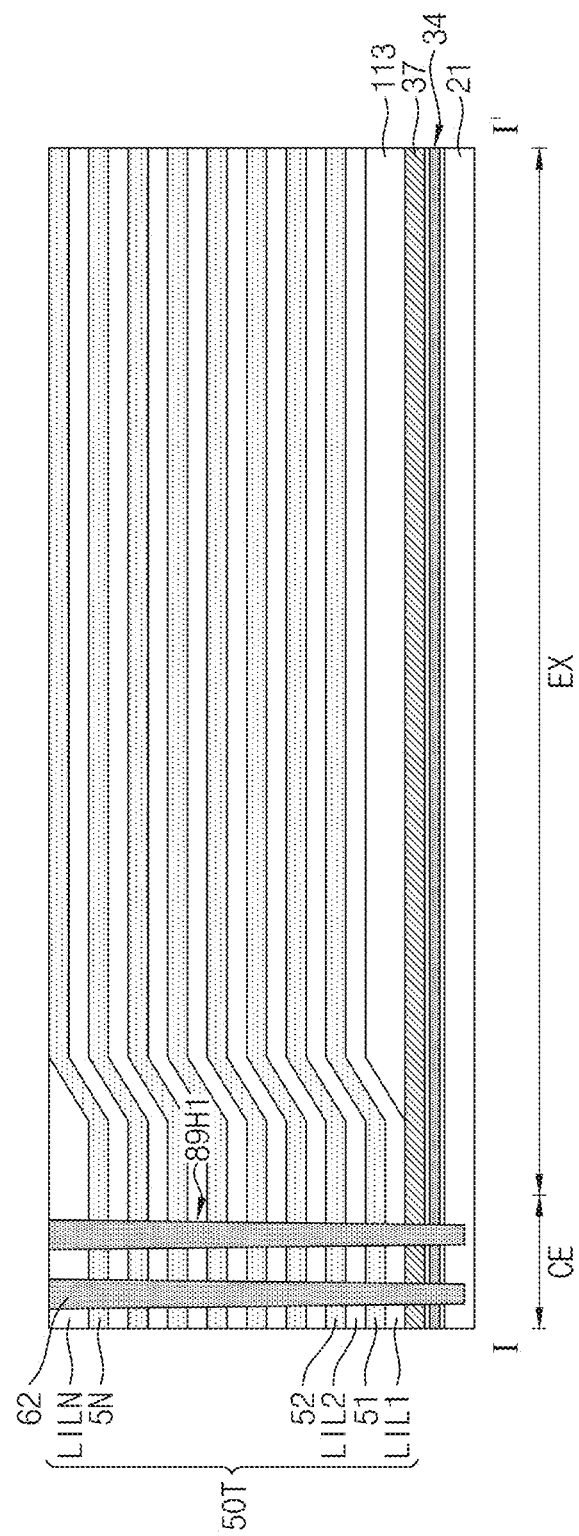

Referring to FIG. 26, an uppermost layer 5N of the plurality of lower sacrificial layers 51, 52, and 5N may be exposed in the connection region EX using a planarization process. A plurality of lower channel holes 89H1 may be formed in the cell region CE to vertically pass through the preliminary lower stack structure 50T, the support plate 37, and the source mold layer 34. A channel sacrificial layer 62 may be formed inside the plurality of lower channel holes 89H1. The uppermost layer LILN of the plurality of lower insulating layers LIL1, LIL2, and LILN may remain in the cell region CE. Top surfaces of the uppermost layer LILN of the plurality of lower insulating layers LIL1, LIL2, and LILN, the uppermost layer 5N of the plurality of lower sacrificial layers 51, 52, and 5N, and the channel sacrificial layer 62 may be exposed on the same planar surface.

The channel sacrificial layer 62 may include a material having an etch selectivity with respect to the preliminary lower stack structure 50T, the support plate 37, the source mold layer 34, and the substrate 21. For example, the channel sacrificial layer 62 may include a metal, a metal nitride, a metal oxide, polysilicon, silicon oxide, silicon nitride, silicon oxynitride, or a combination thereof.

Figure 27:
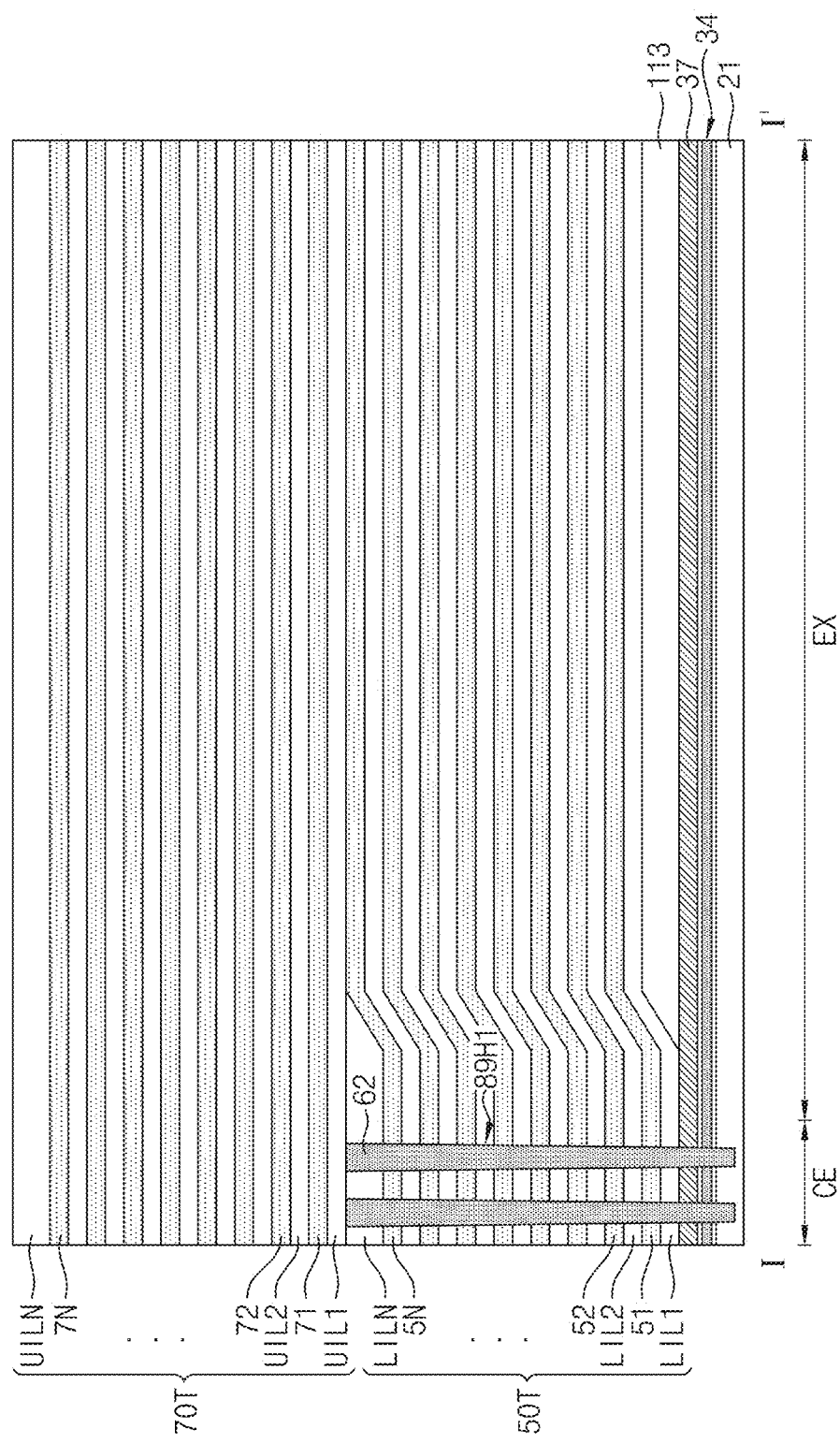

Referring to FIG. 27, a preliminary upper stack structure 70T may be formed on the preliminary lower stack structure 50T. The preliminary upper stack structure 70T may cover the cell region CE and the connection region EX. The preliminary upper stack structure 70T may include a plurality of upper insulating layers UIL1, UIL2, and UILN and a plurality of upper sacrificial layers 71, 72, and 7N, which are alternately stacked on each other.

The plurality of upper sacrificial layers 71, 72, and 7N may include a material having an etch selectivity with respect to the plurality of upper insulating layers UIL1, UIL2, and UILN. The plurality of upper insulating layers UIL1, UIL2, and UILN may include the same material as the plurality of lower insulating layers LIL1, LIL2, and LILN. The plurality of upper sacrificial layers 71, 72, and 7N may include the same material as the plurality of lower sacrificial layers 51, 52, and 5N.

A lowermost layer UIL1 of the preliminary upper stack structure 70T may be a lowermost layer UIL1 of the plurality of upper insulating layers UIL1, UIL2, and UILN, and an uppermost layer UILN of the preliminary upper stack structure 70T may be an uppermost layer UILN of the plurality of upper insulating layers UIL1, UIL2, and UILN. The lowermost layer UIL1 of the plurality of upper insulating layers UIL1, UIL2, and UILN may be in direct contact with the uppermost layer LILN of the plurality of lower insulating layers LIL1, LIL2, and LILN and the uppermost layer 5N of the plurality of lower sacrificial layers 51, 52, and 5N.

In the connection region EX, each of distances between the plurality of lower sacrificial layers 51, 52, and 5N, each of distances between the plurality of upper sacrificial layers 71, 72, and 7N, and a distance between the uppermost layer 5N of the plurality of lower sacrificial layers 51, 52, and 5N and a lowermost layer 71 of the plurality of upper sacrificial layers 71, 72, and 7N may be substantially equal to each other. In the cell region CE, a distance between the uppermost layer 5N of the plurality of lower sacrificial layers 51, 52, and 5N and the lowermost layer 71 of the plurality of upper sacrificial layers 71, 72, and 7N may be relatively greater than each of the distances between the plurality of lower sacrificial layers 51, 52, and 5N and each of the distances between the plurality of upper sacrificial layers 71, 72, and 7N.

Figure 28:
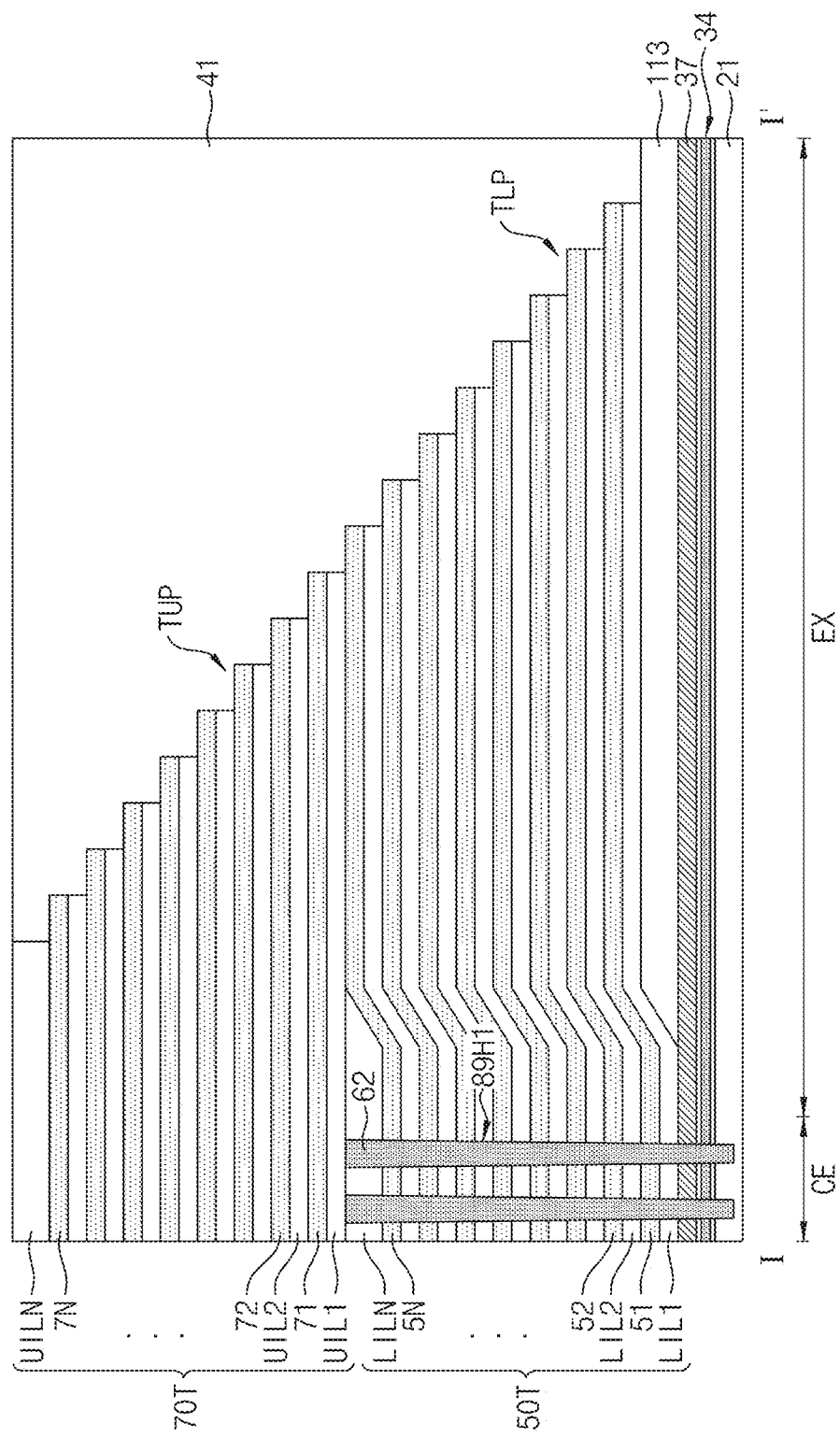

Referring to FIG. 28, the plurality of lower insulating layers LIL1, LIL2, and LILN, the plurality of lower sacrificial layers 51, 52, and 5N, the plurality of upper insulating layers UIL1, UIL2, and UILN, and the plurality of upper sacrificial layers 71, 72, and 7N may be partially removed to form a plurality of preliminary lower pad portions TLP and a plurality of preliminary upper pad portions TUP. A fourth insulating layer 41 may be formed on the plurality of preliminary lower pad portions TLP and the plurality of preliminary upper pad portions TUP.

The plurality of preliminary lower pad portions TLP and the plurality of preliminary upper pad portions TUP may be sequentially offset aligned with each other in the connection region EX. Each of the plurality of preliminary lower pad portions TLP and the plurality of preliminary upper pad portions TUP may be continuous with a side surface of a corresponding one of the plurality of lower sacrificial layers 51, 52, and 5N and the plurality of upper sacrificial layers 71, 72, and 7N. A bottom surface of each of the pad portions of preliminary lower pad portions TLP and the plurality of preliminary upper pads TUP may be substantially coplanar with a bottom surface of a corresponding one of the plurality of lower sacrificial layers 51, 52, and 5N and the plurality of upper sacrificial layers 71, 72, and 7N. The plurality of preliminary lower pad portions TLP and the plurality of preliminary upper pad portions TUP may exhibit a staircase form.

In the connection region EX, since each of the distances between the plurality of lower sacrificial layers 51, 52, and 5N, each of the distances between the plurality of upper sacrificial layers 71, 72, and 7N, and the distance between the uppermost layer 5N of the plurality of lower sacrificial layers 51, 52, and 5N and the lowermost layer 71 of the plurality of upper sacrificial layers 71, 72, and 7N are substantially equal to each other, a process of forming the plurality of preliminary lower pad portions TLP and the plurality of preliminary upper pad portions TUP may be simplified.

Figure 29:
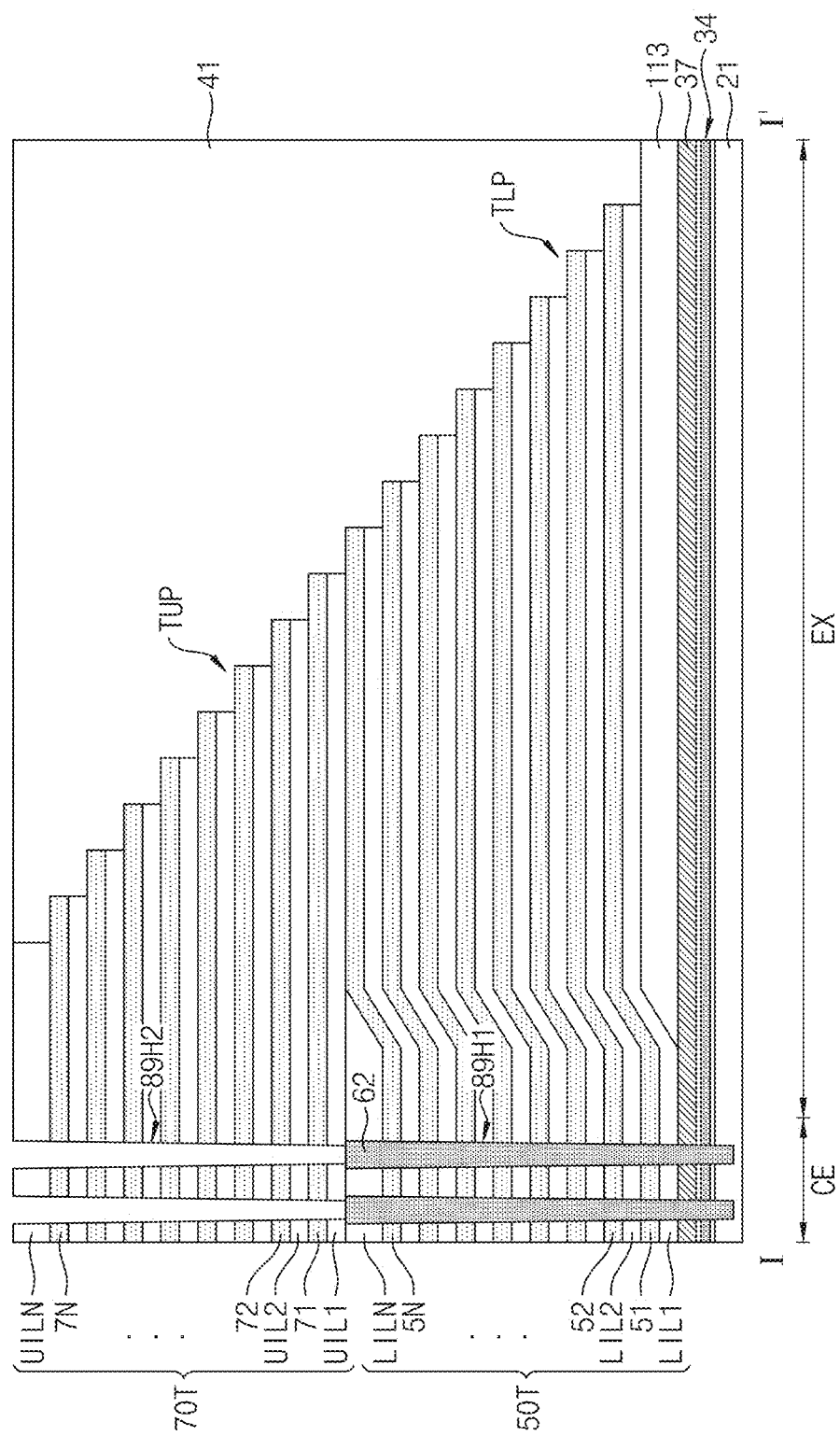

Referring to FIG. 29, in the cell region CE, a plurality of upper channel holes 89H2 may be formed to pass through the preliminary upper stack structure 70T and communicate with the plurality of lower channel holes 89H1. The channel sacrificial layer 62 may be exposed at bottoms of the plurality of upper channel holes 89H2.

Figure 30:
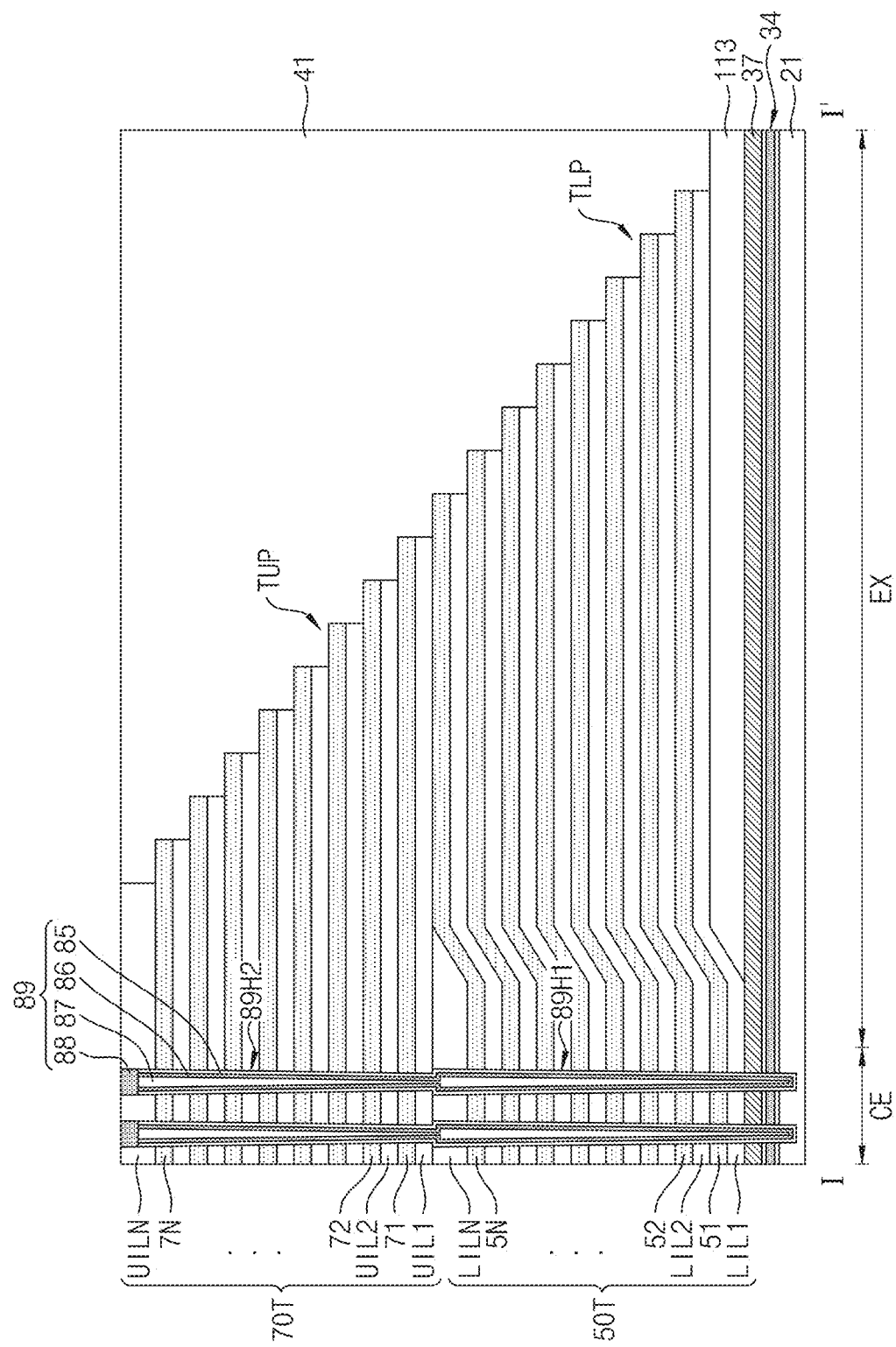

Referring to FIG. 30, the channel sacrificial layer 62 may be removed so that the plurality of lower channel holes 89H1 may communicate with (or communicatively couple with or connected to) the plurality of upper channel holes 89H2. A plurality of channel structures 89 may be formed inside the plurality of lower channel holes 89H1 and the plurality of upper channel holes 89H2. Each of the plurality of channel structures 89 may include an information storage pattern 85, a channel pattern 86, a core pattern 87, and a bit pad 88. The bit pad 88 may include a semiconductor layer (e.g., polysilicon). For example, the bit pad 88 may include an N-type polysilicon layer. In an example embodiment, the bit pad 88 may serve as a drain region.

Figure 31:
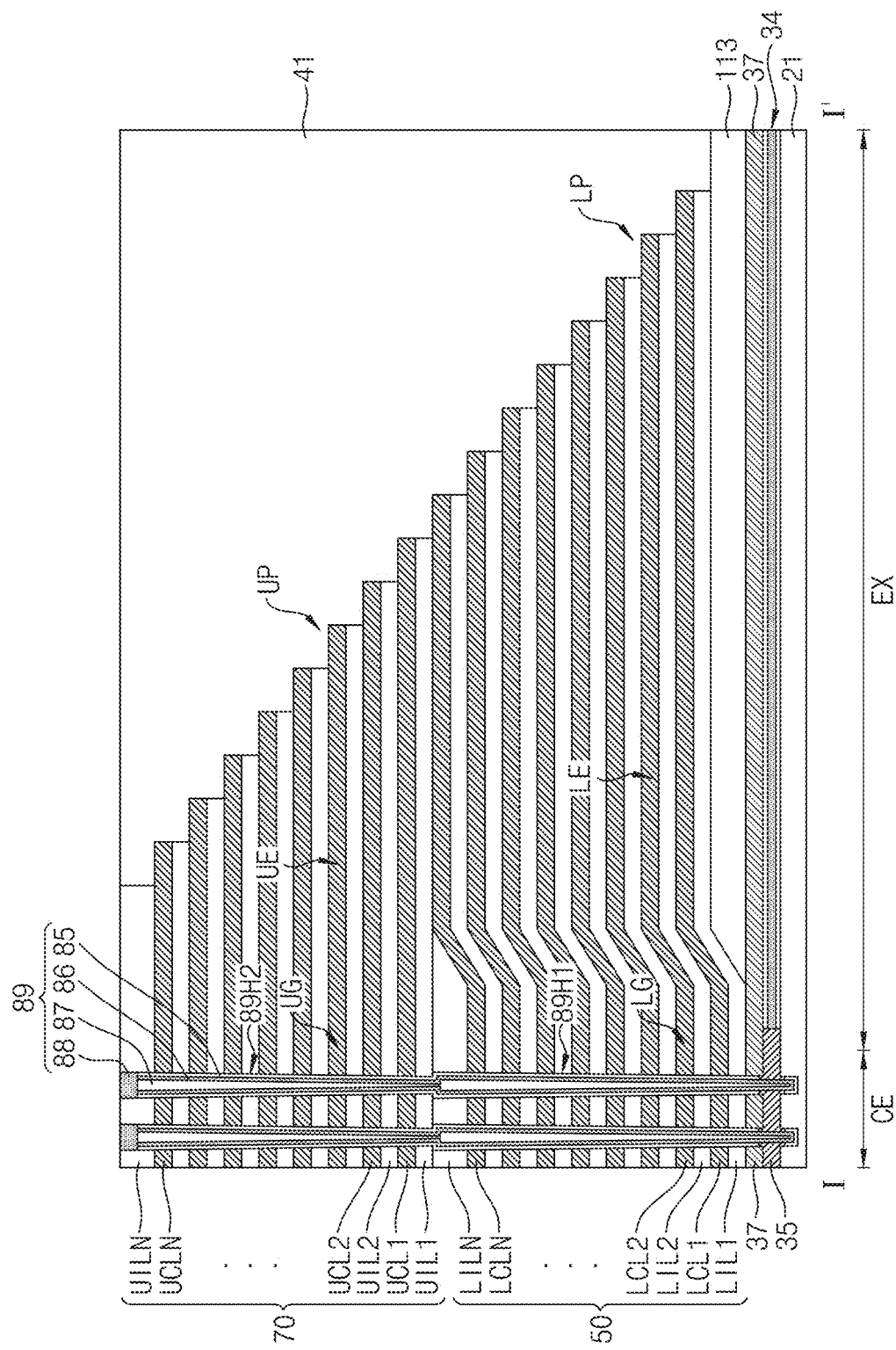

Referring to FIG. 31, the source mold layer 34 may be partially removed to form a replacement conductive line 35. The source mold layer 34 may remain in the connection region EX. The replacement conductive line 35 may be formed in the cell region CE. A side surface of the replacement conductive line 35 may be in direct contact with a side surface of the source mold layer 34. The replacement conductive line 35 may pass through the information storage pattern 85 and be in direct contact with a side surface of the channel pattern 86.

The plurality of lower sacrificial layers 51, 52, and 5N and the plurality of upper sacrificial layers 71, 72, and 7N may be removed to form a plurality of lower interconnection layers LCL1, LCL2, and LCLN and a plurality of upper interconnection layers UCL1, UCL2, and UCLN. The plurality of lower insulating layers LIL1, LIL2, and LILN and the plurality of lower interconnection layers LCL1, LCL2, and LCLN, which are alternately stacked on each other, may constitute a lower stack structure 50. The plurality of upper insulating layers UIL1, UIL2, and UILN and the plurality of upper interconnection layers UCL1, UCL2, UCLN, which are alternately stacked on each other, may constitute an upper stack structure 70.

Referring back to FIG. 9, a fifth insulating layer 43 may be formed on the upper stack structure 70 and the fourth insulating layer 41. A plurality of cell contact plugs 91 may be formed to pass through the fifth insulating layer 43 and the fourth insulating layer 41 and be in contact with the lower pad portions LP and the upper pad portions UP. A plurality of bit plugs 93 may be formed to pass through the fifth insulating layer 43 and be in contact with the bit pads 88. A plurality of upper circuit interconnections 95 and a plurality of bit lines 97 may be formed on the fifth insulating layer 43.

Figure 32:
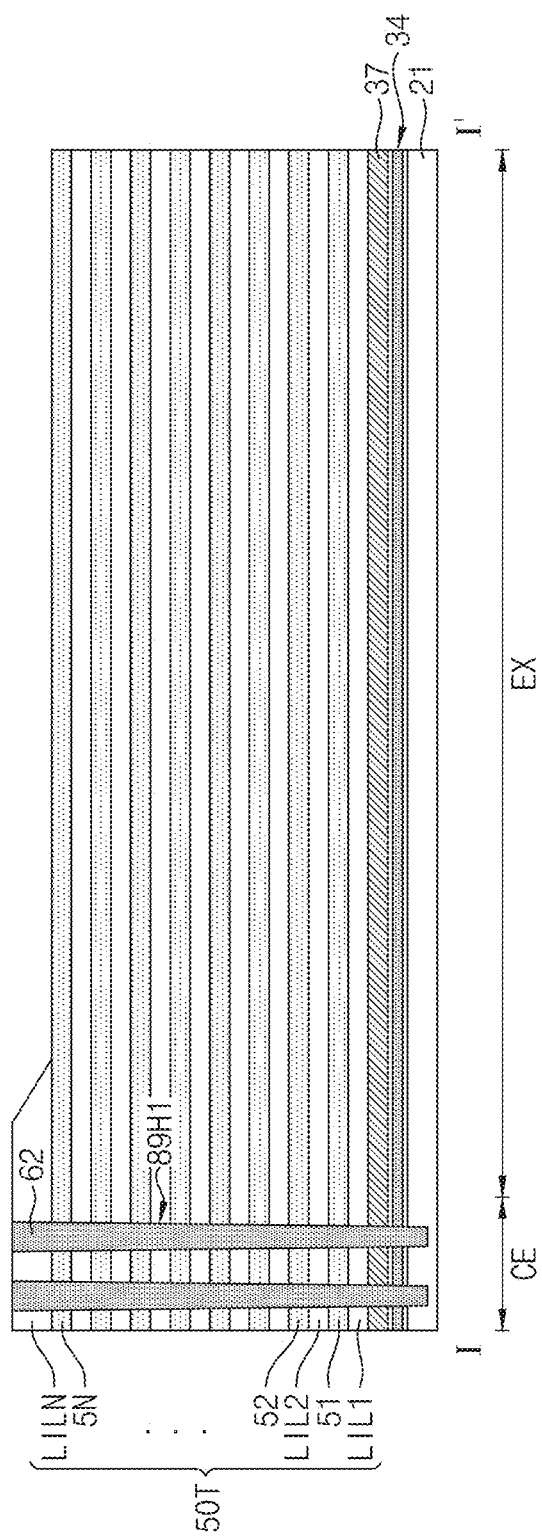
Figure 33:
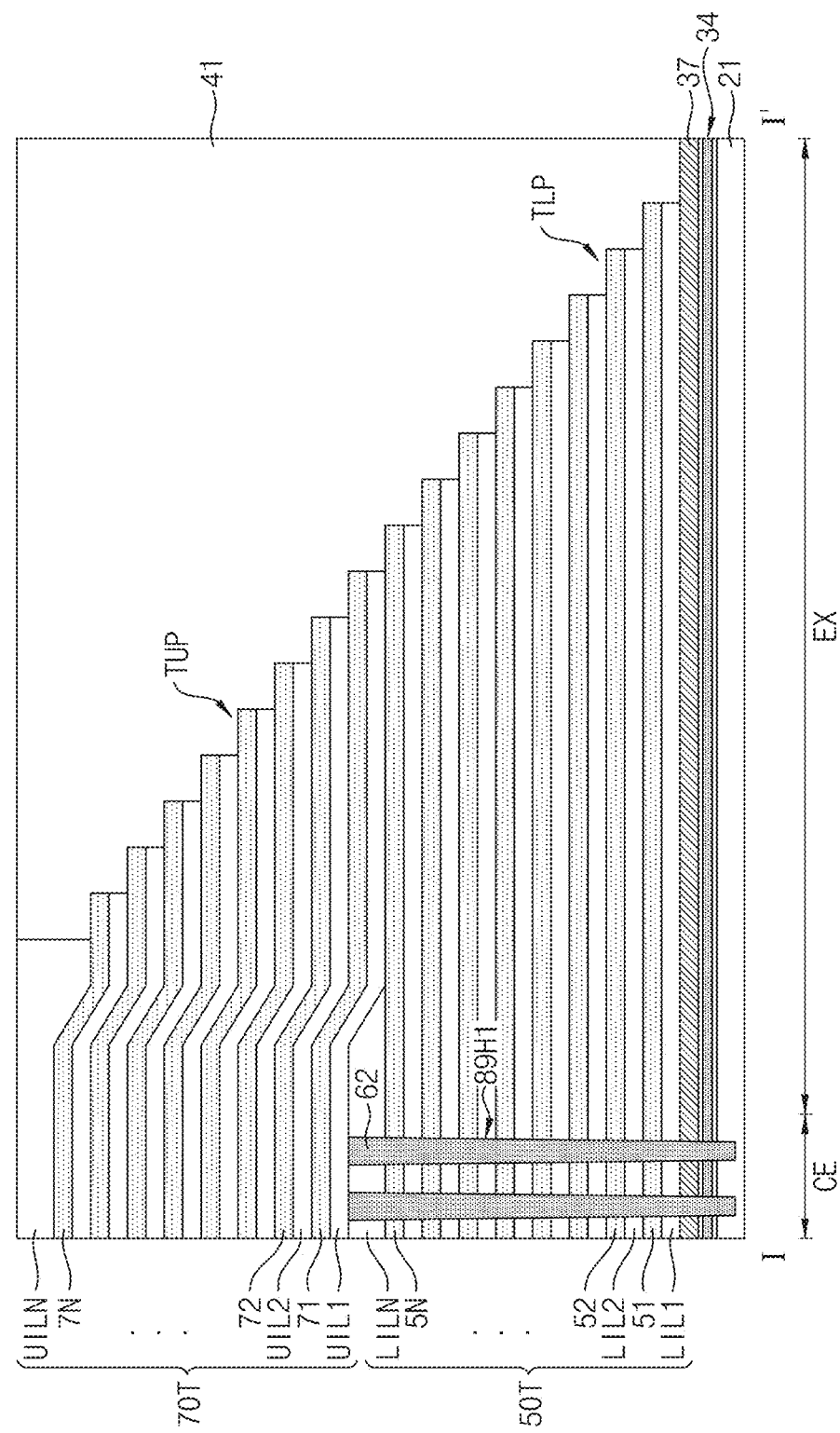

FIGS. 32 and 33 are cross-sectional views taken along line I-I' of FIG. 2, illustrating a method of forming a semiconductor device according to an embodiment of the inventive concepts.

Referring to FIG. 32, a source mold layer 34 and a support plate 37 may be sequentially formed on a substrate 21. A preliminary lower stack structure 50T may be formed on the substrate 21 having the support plate 37. The preliminary lower stack structure 50T may cover the cell region CE and the connection region EX. The preliminary lower stack structure 50T may include a plurality of lower insulating layers LIL1, LIL2, and LILN and a plurality of lower sacrificial layers 51, 52, and 5N, which are alternately stacked on each other.

A plurality of lower channel holes 89H1 may be formed in the cell region CE to vertically pass through the preliminary lower stack structure 50T, the support plate 37, and the source mold layer 34. A channel sacrificial layer 62 may be formed inside the plurality of lower channel holes 89H1. An uppermost layer LILN of the plurality of lower insulating layers LIL1, LIL2, and LILN may be partially removed to expose an uppermost layer 5N of the plurality of lower sacrificial layers 51, 52, and 5N in the connection region EX. The uppermost layer LILN of the plurality of lower insulating layers LIL1, LIL2, and LILN may remain in the cell region CE. The uppermost layer LILN of the plurality of lower insulating layers LIL1, LIL2, and LILN may be relatively thicker than each of other layers LIL1 and LIL2 of the plurality of lower insulating layers LIL1, LIL2, and LILN.

A process of partially removing the uppermost layer LILN of the plurality of lower insulating layers LIL1, LIL2, and LILN may include a process the same as or substantially similar to that described with reference to FIGS. 18 to 24. The uppermost layer LILN of the plurality of lower insulating layers LIL1, LIL2, and LILN may include inclined side surfaces adjacent to a boundary between the cell region CE and the connection region EX.

Referring to FIG. 33, a preliminary upper stack structure 70T may be formed on the preliminary lower stack structure 50T. The preliminary upper stack structure 70T may include a plurality of upper insulating layers UIL1, UIL2, and UILN and a plurality of upper sacrificial layers 71, 72, and 7N, which are alternately stacked on each other. A lowermost layer UIL1 of the plurality of upper insulating layers UIL1, UIL2, and UILN may be in direct contact with the uppermost layer LILN of the plurality of lower insulating layers LIL1, LIL2, and LILN and the uppermost layer 5N of the plurality of lower sacrificial layers 51, 52, and 5N.

The plurality of lower insulating layers LIL1, LIL2, and LILN, the plurality of lower sacrificial layers 51, 52, and 5N, the plurality of upper insulating layers UIL1, UIL2, and UILN, and the plurality of upper sacrificial layers 71, 72, and 7N may be partially removed to form a plurality of preliminary lower pad portions TLP and a plurality of preliminary upper pad portions TUP. A fourth insulating layer 41 may be formed on the plurality of preliminary lower pad portions TLP and the plurality of preliminary upper pad portions TUP.

In the connection region EX, each of distances between the plurality of lower sacrificial layers 51, 52, and 5N, each of distances between the plurality of upper sacrificial layers 71, 72, and 7N, and a distance between the uppermost layer 5N of the plurality of lower sacrificial layers 51, 52, and 5N and the lowermost layer 71 of the plurality of upper sacrificial layers 71, 72, and 7N may be substantially equal to each other. In the cell region CE, the distance between the uppermost layer 5N of the plurality of lower sacrificial layers 51, 52, and 5N and the lowermost layer 71 of the plurality of upper sacrificial layers 71, 72, and 7N may be relatively greater than each of the distances between the plurality of lower sacrificial layers 51, 52, and 5N and each of the distances between the plurality of upper sacrificial layers 71, 72, and 7N.

Referring back to FIG. 11, a plurality of upper channel holes 89H2 may be formed to communicate with the plurality of lower channel holes 89H1. The channel sacrificial layer 62 may be removed so that the plurality of lower channel holes 89H1 may communicate with the plurality of upper channel holes 89H2. A plurality of channel structures 89 may be formed inside the plurality of lower channel holes 89H1 and the plurality of upper channel holes 89H2.

The source mold layer 34 may be partially removed to form a replacement conductive line 35. The plurality of lower sacrificial layers 51, 52, and 5N and the plurality of upper sacrificial layers 71, 72, and 7N may be removed to form a plurality of lower interconnection layers LCL1, LCL2, and LCLN and a plurality of upper interconnection layers UCL1, UCL2, and UCLN.

FIGS. 34 to 37 are cross-sectional views taken along line I-I' of FIG. 2, illustrating a method of forming a semiconductor device according to an embodiment of the inventive concepts.

Figure 34:
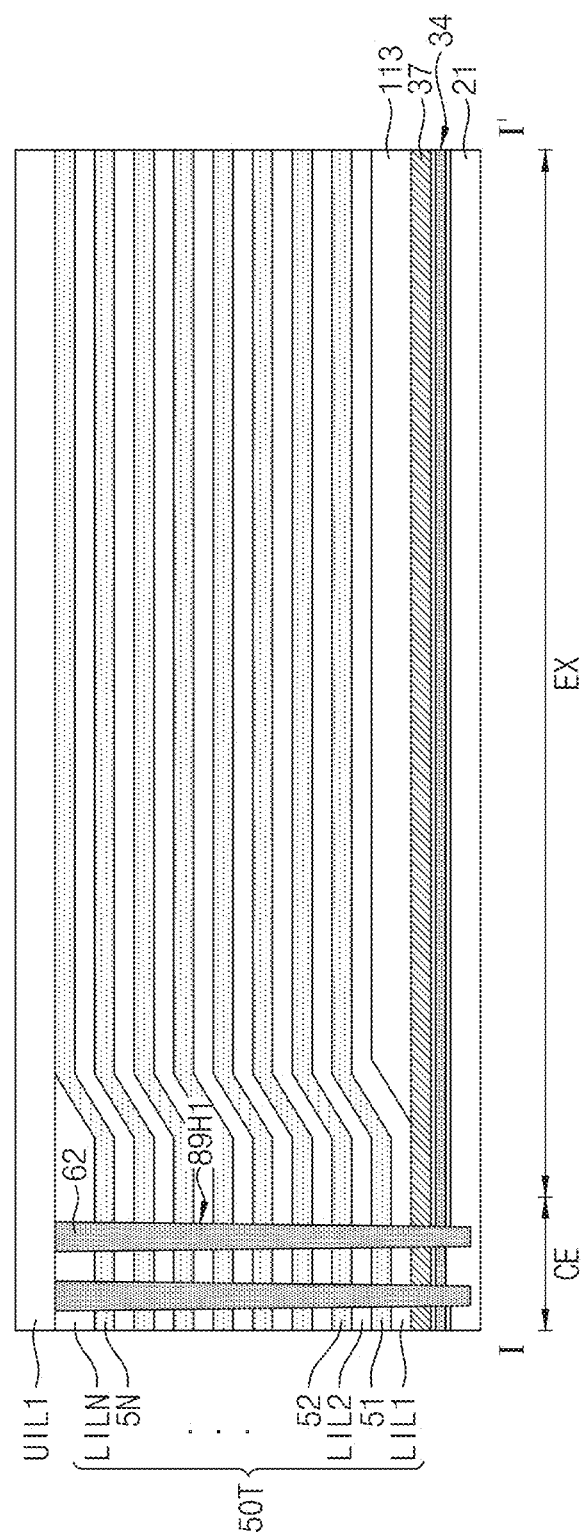

Referring to FIG. 34, a source mold layer 34, a support plate 37, a preliminary lower stack structure 50T, a plurality of lower channel holes 89H1, a channel sacrificial layer 62, and a lower spacer 113 may be formed on a substrate 21. The preliminary lower stack structure 50T may include a plurality of lower insulating layers LIL1, LIL2, and LILN and a plurality of lower sacrificial layers 51, 52, and 5N, which are alternately stacked on each other. A first upper insulating layer UIL1 may be formed on an uppermost layer LILN of the plurality of lower insulating layers LIL1, LIL2, and LILN and an uppermost layer 5N of the plurality of lower sacrificial layers 51, 52, and 5N. A thickness of the first upper insulating layer UIL1 may be relatively greater than a thickness of each of the plurality of lower insulating layers LIL1, LIL2, and LILN excluding the uppermost layer LILN.

Figure 35:
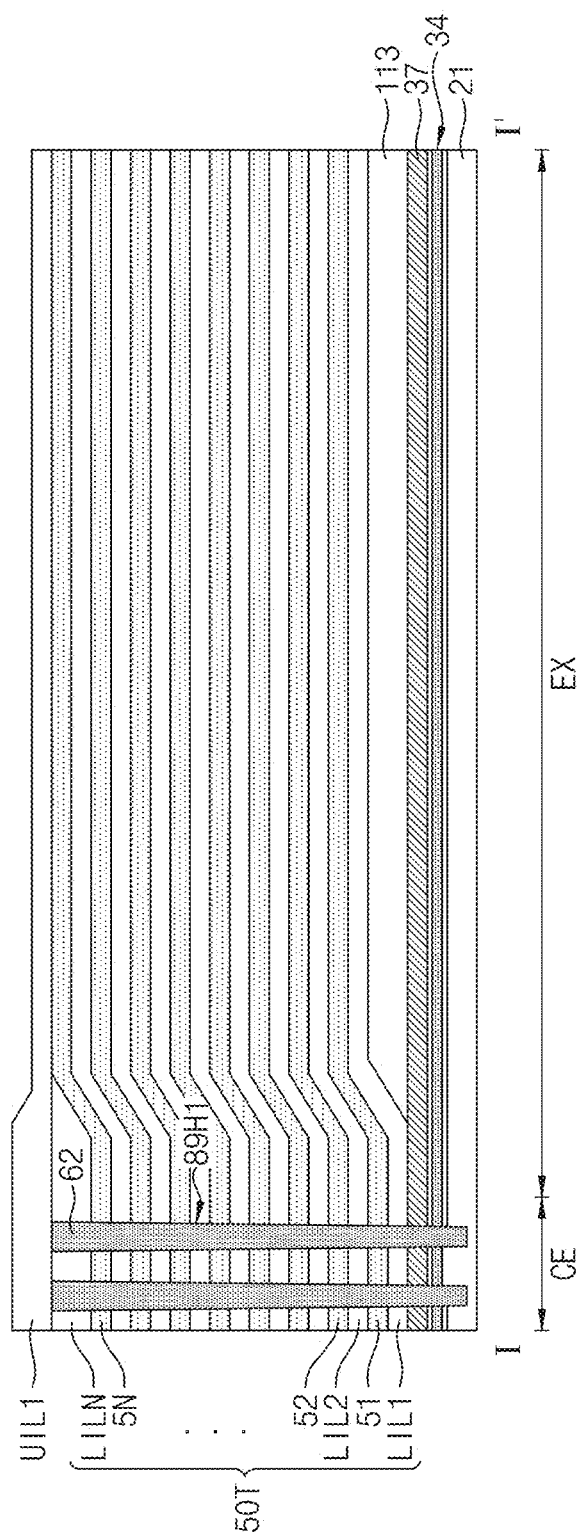

Referring to FIG. 35, the first upper insulating layer UIL1 may be partially recessed to reduce a thickness of the first upper insulating layer UIL1 in the connection region EX. In the connection region EX, the thickness of the first upper insulating layer UIL1 may be substantially equal to the thickness of each of the plurality of lower insulating layers LIL1, LIL2, and LILN excluding the uppermost layer LILN.

Figure 36:
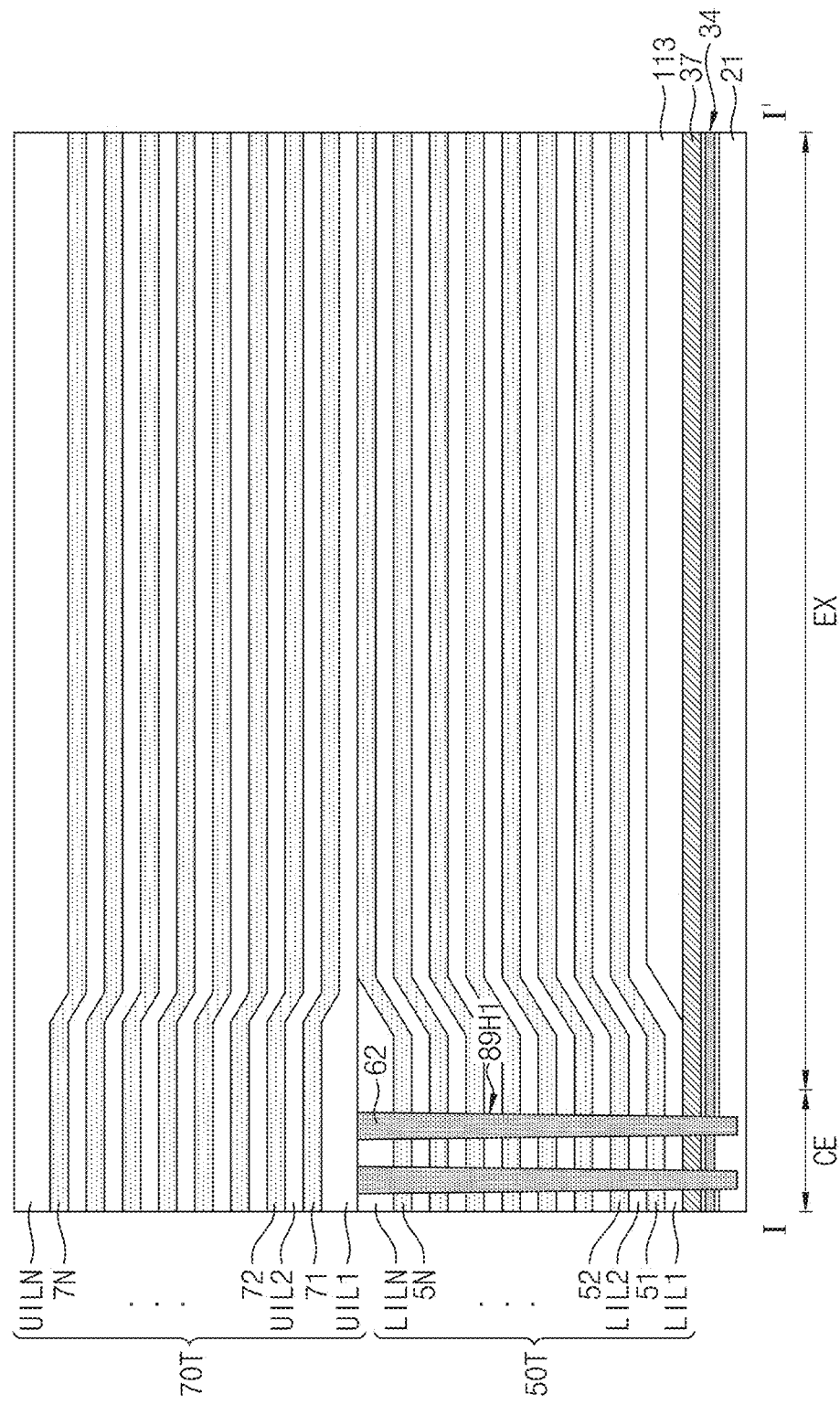

Referring to FIG. 36, a plurality of other upper insulating layers UIL2 and UILN and a plurality of upper sacrificial layers 71, 72, and 7N may be alternately stacked on each other on the first upper insulating layer UIL1. The first upper insulating layer UIL1 and the plurality of other upper insulating layers UIL2 and UILN may constitute a plurality of upper insulating layers UIL1, UIL2, and UILN. The first upper insulating layer UIL1 may correspond to a lowermost layer UIL1 of the plurality of upper insulating layers UIL1, UIL2, and UILN. The plurality of upper insulating layers UIL1, UIL2, and UILN and the plurality of upper sacrificial layers 71, 72, and 7N may constitute a preliminary upper stack structure 70T.

In the connection region EX, each of distances between the plurality of lower sacrificial layers 51, 52, and 5N, each of distances between the plurality of upper sacrificial layers 71, 72, and 7N, and a distance between the uppermost layer 5N of the plurality of lower sacrificial layers 51, 52, and 5N and the lowermost layer 71 of the plurality of upper sacrificial layers 71, 72, and 7N may be substantially equal to each other. In the cell region CE, the distance between the uppermost layer 5N of the plurality of lower sacrificial layers 51, 52, and 5N and the lowermost layer 71 of the plurality of upper sacrificial layers 71, 72, and 7N may be relatively greater than each of the distances between the plurality of lower sacrificial layers 51, 52, and 5N and each of the distances between the plurality of upper sacrificial layers 71, 72, and 7N.

Figure 37:
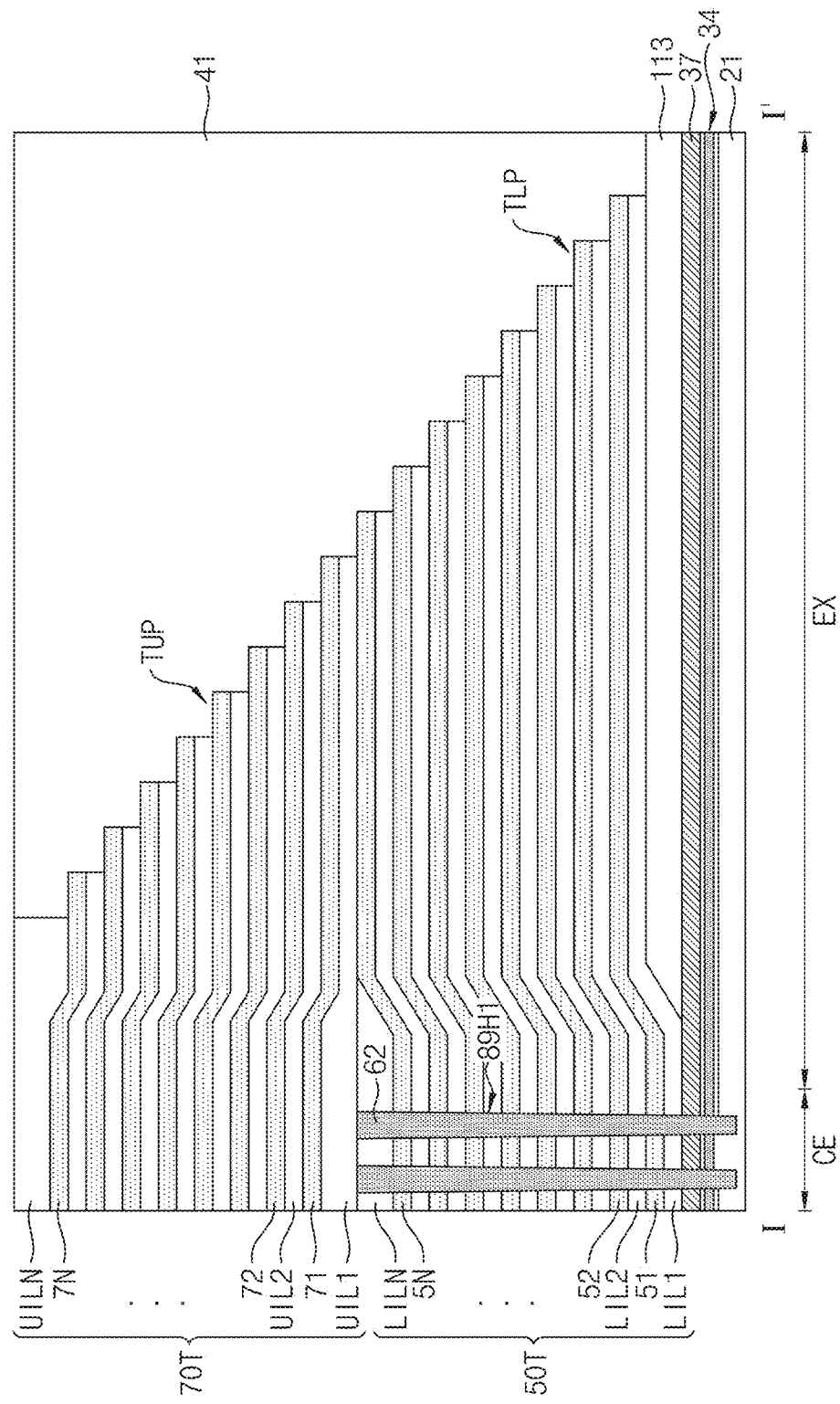

Referring to FIG. 37, the plurality of lower insulating layers LIL1, LIL2, and LILN, the plurality of lower sacrificial layers 51, 52, and 5N, the plurality of upper insulating layers UIL1, UIL2, and UILN, and the plurality of upper sacrificial layers 71, 72, and 7N may be partially removed to form a plurality of preliminary lower pad portions TLP and a plurality of preliminary upper pad portions TUP. A fourth insulating layer 41 may be formed on the plurality of preliminary lower pad portions TLP and the plurality of preliminary upper pad portions TUP.

Referring back to FIG. 13, a plurality of upper channel holes 89H2 may be formed to communicate with the plurality of lower channel holes 89H1. A plurality of channel structures 89 may be formed inside the plurality of lower channel holes 89H1 and the plurality of upper channel holes 89H2. The source mold layer 34 may be partially removed to form a replacement conductive line 35. The plurality of lower sacrificial layers 51, 52, and 5N and the plurality of upper sacrificial layers 71, 72, and 7N may be removed to form a plurality of lower interconnection layers LCL1, LCL2, and LCLN and a plurality of upper interconnection layers UCL1, UCL2, and UCLN.

FIGS. 38 to 42 are cross-sectional views taken along line I-I' of FIG. 2, illustrating a method of forming a semiconductor device according to an embodiment of the inventive concepts.

Figure 38:
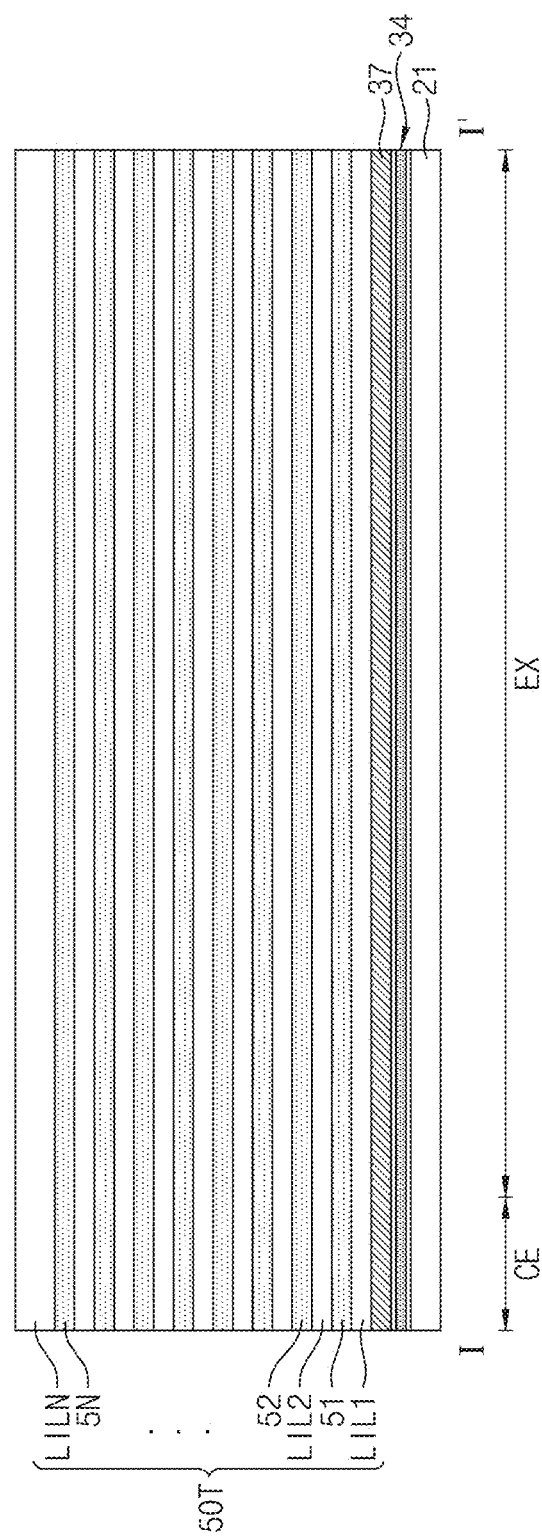

Referring to FIG. 38, a source mold layer 34, a support plate 37, and a preliminary lower stack structure 50T may be formed on a substrate 21. The preliminary lower stack structure 50T may include a plurality of lower insulating layers LIL1, LIL2, and LILN and a plurality of lower sacrificial layers 51, 52, and 5N, which are alternately stacked on each other. A thickness of an uppermost layer LILN of the plurality of lower insulating layers LIL1, LIL2, and LILN may be relatively greater than a thickness of each of other layers LIL1 and LIL2 of the plurality of lower insulating layers LIL1, LIL2, and LILN.

Figure 39:
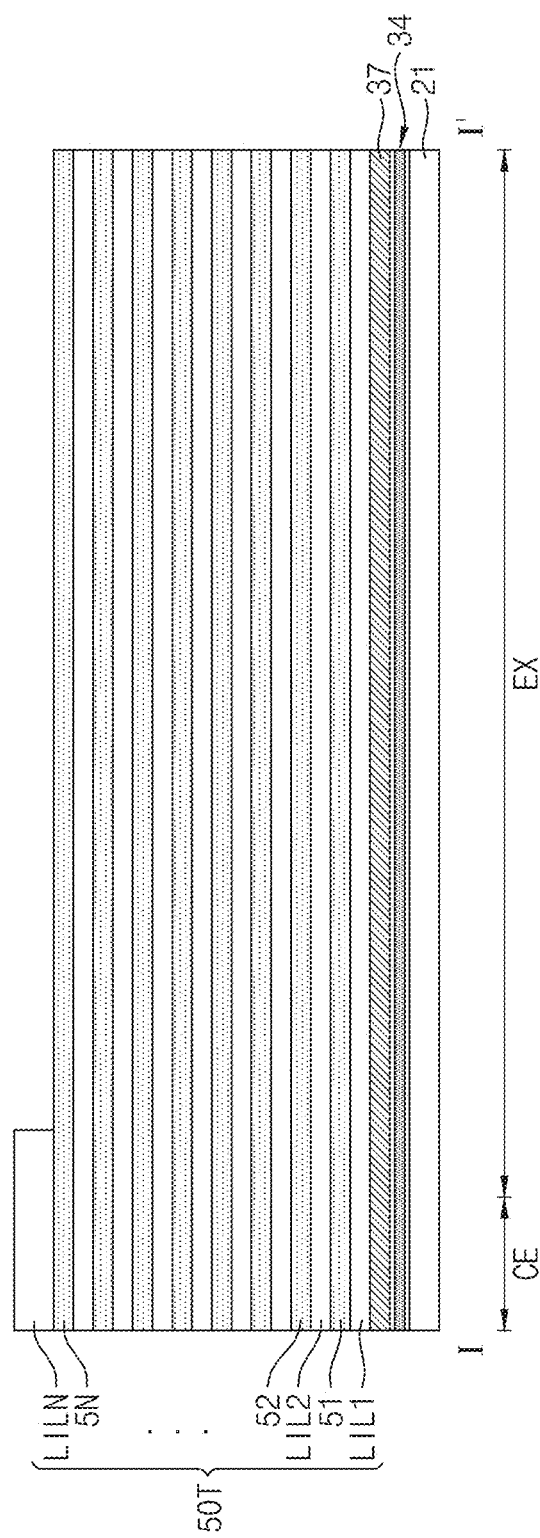

Referring to FIG. 39, the uppermost layer LILN of the plurality of lower insulating layers LIL1, LIL2, and LILN may be partially removed to expose an uppermost layer 5N of the plurality of lower sacrificial layers 51, 52, and 5N in the connection region EX. The uppermost layer LILN of the plurality of lower insulating layers LIL1, LIL2, and LILN may remain in the cell region CE.

Figure 40:
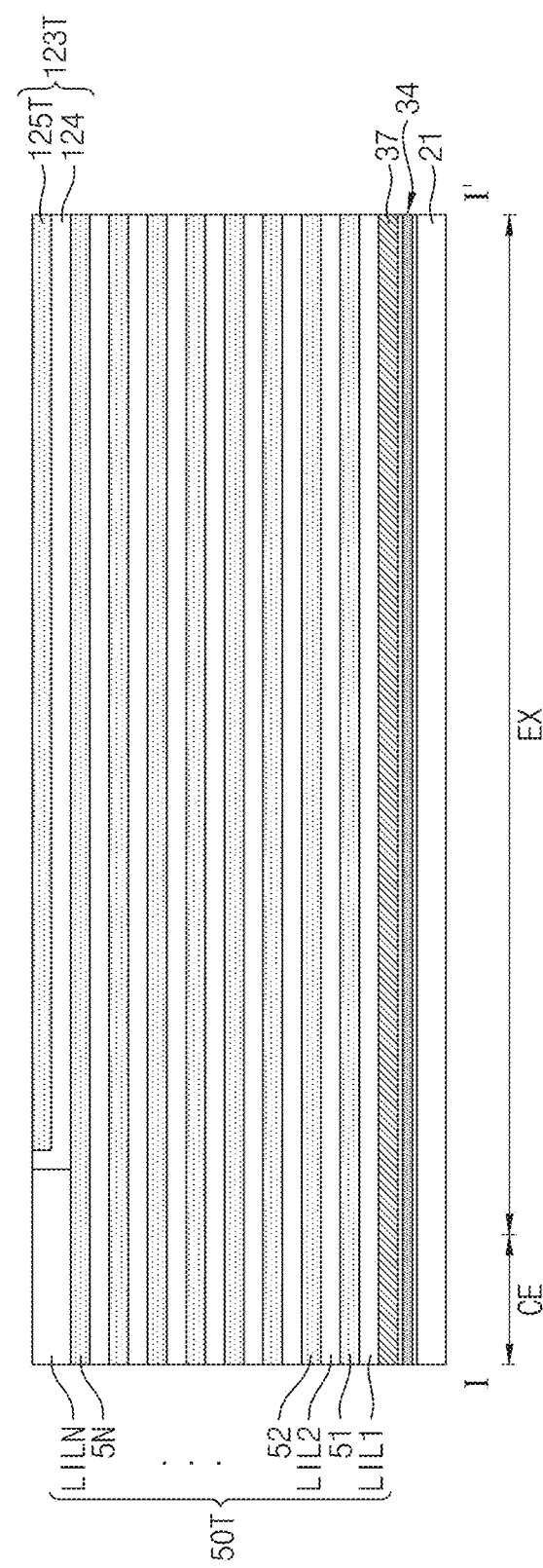

Referring to FIG. 40, a preliminary middle spacer structure 123T may be formed on an uppermost layer 5N of the plurality of lower sacrificial layers 51, 52, and 5N in the connection region EX. The preliminary middle spacer structure 123T may include a first dummy insulating layer 124 and a first dummy sacrificial layer 125T disposed on the first dummy insulating layer 124. The formation of the preliminary middle spacer structure 123T may include performing a plurality of thin-film forming processes and a planarization process. The planarization process may include a chemical mechanical polishing (CMP) process, an etchback process, or a combination thereof. Top surfaces of the uppermost layer LILN of the plurality of lower insulating layers LIL1, LIL2, and LILN, the first dummy insulating layer 124, and the first dummy sacrificial layer 125T may be exposed on substantially the same planar surface.

In the connection region EX, a thickness of the first dummy insulating layer 124 may be substantially equal to a thickness of each of other layers LIL1 and LIL2 other than the uppermost layer LILN of the plurality of lower insulating layers LIL1, LIL2, and LILN. A thickness of the first dummy sacrificial layer 125T may be substantially equal to a thickness of each of the plurality of lower sacrificial layers 51, 52, and 5N.

Figure 41:
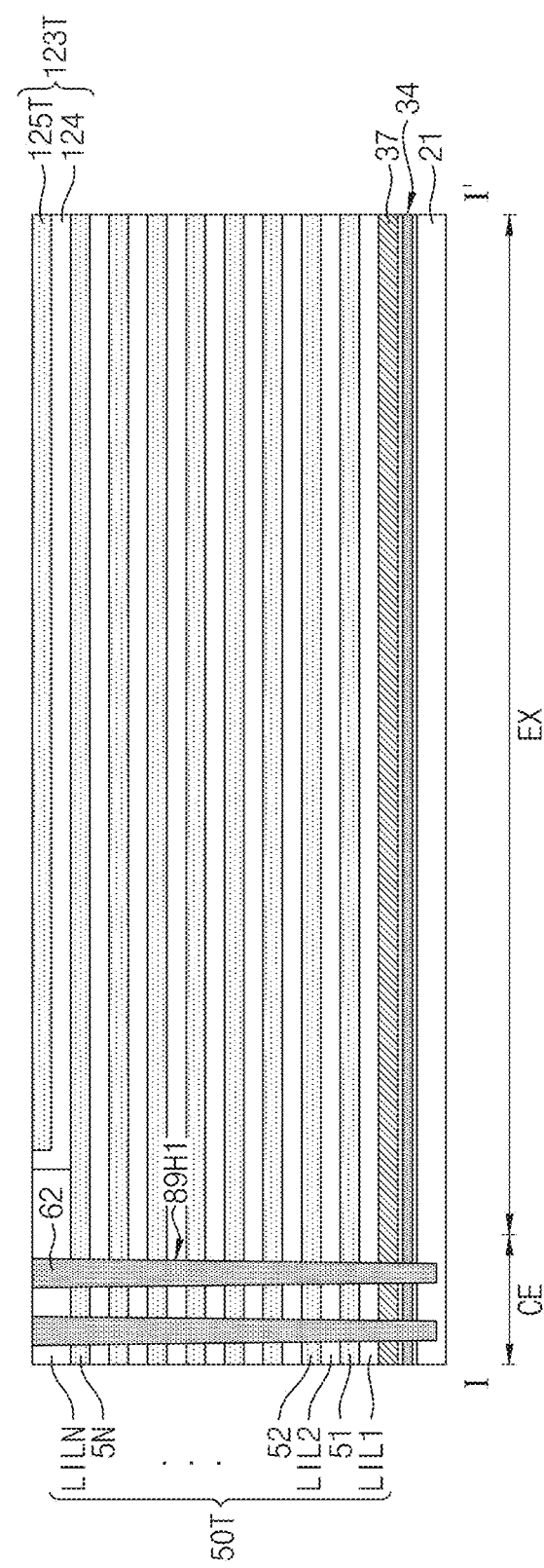

Referring to FIG. 41, a plurality of lower channel holes 89H1 and a channel sacrificial layer 62 may be formed.

Figure 42:
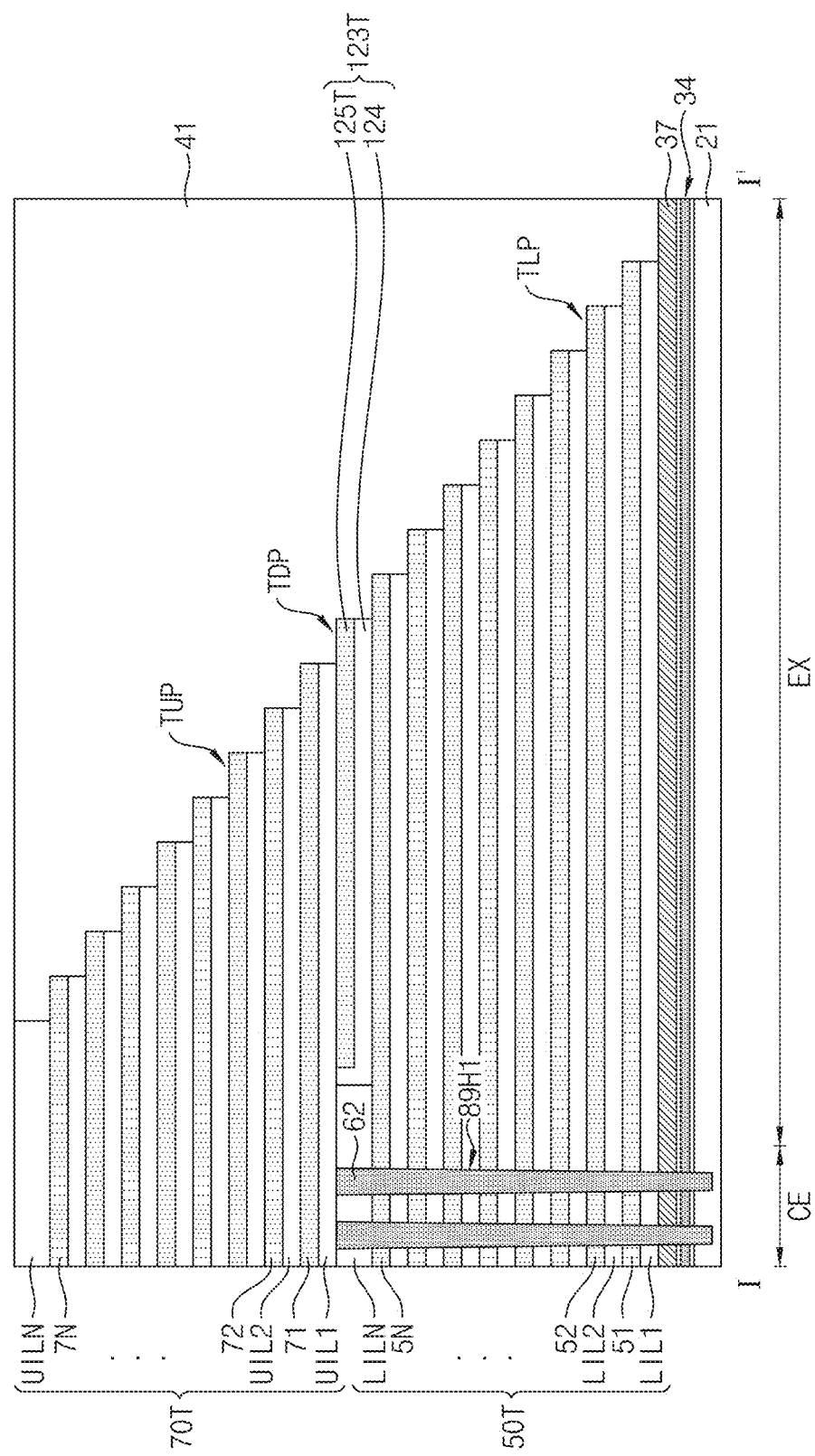

Referring to FIG. 42, a preliminary upper stack structure 70T may be formed on the preliminary lower stack structure 50T and the preliminary middle spacer structure 123T. The preliminary upper stack structure 70T may include a plurality of upper insulating layers UIL1, UIL2, and UILN and a plurality of upper sacrificial layers 71, 72, and 7N, which are alternately stacked on each other. A lowermost layer UIL1 of the plurality of upper insulating layers UIL1, UIL2, and UILN may be in direct contact with the uppermost layer LILN of the plurality of lower insulating layers LIL1, LIL2, and LILN and the first dummy sacrificial layer 125T.

The plurality of lower insulating layers LIL1, LIL2, and LILN, the plurality of lower sacrificial layers 51, 52, and 5N, the first dummy insulating layer 124, the first dummy sacrificial layer 125T, the plurality of upper insulating layers UIL1, UIL2, and UILN, and the plurality of upper sacrificial layers 71, 72, and 7N may be partially removed to form a plurality of preliminary lower pad portions TLP, a preliminary dummy pad portion TDP, and a plurality of preliminary upper pad portions TUP. A fourth insulating layer 41 may be formed on the plurality of preliminary lower pad portions TLP, the preliminary dummy pad portion TDP, and the plurality of preliminary upper pad portions TUP.

In the connection region EX, each of distances between the plurality of lower sacrificial layers 51, 52, and 5N, each of distances between the plurality of upper sacrificial layers 71, 72, and 7N, a distance between the uppermost layer 5N of the plurality of lower sacrificial layers 51, 52, and 5N and the first dummy sacrificial layer 125T, and a distance between a lowermost layer 71 of the plurality of upper sacrificial layers 71, 72, and 7N and the first dummy sacrificial layer 125T may be substantially equal to each other. In the cell region CE, a distance between the uppermost layer 5N of the plurality of lower sacrificial layers 51, 52, and 5N and the lowermost layer 71 of the plurality of upper sacrificial layers 71, 72, and 7N may be relatively greater than each of the distances between the plurality of lower sacrificial layers 51, 52, and 5N and each of the distances between the plurality of upper sacrificial layers 71, 72, and 7N.

Referring back to FIG. 14, a plurality of upper channel holes 89H2 may be formed to communicate with the plurality of lower channel holes 89H1. A plurality of channel structures 89 may be formed inside the plurality of lower channel holes 89H1 and the plurality of upper channel holes 89H2. The source mold layer 34 may be partially removed to form a replacement conductive line 35. The plurality of lower sacrificial layers 51, 52, and 5N, the first dummy sacrificial layer 125T, and the plurality of upper sacrificial layers 71, 72, and 7N may be removed to form a plurality of lower interconnection layers LCL1, LCL2, and LCLN, a first dummy interconnection layer 125, and a plurality of upper interconnection layers UCL1, UCL2, and UCLN. The first dummy insulating layer 124 and the first dummy interconnection layer 125 may constitute a first middle spacer structure 123.

According to the disclosed example embodiments of the inventive concepts, an upper stack structure can be provided on a lower stack structure. A distance between an uppermost gate electrode of the lower stack structure and a lowermost gate electrode of the upper stack structure may be greater than each of distances between respective two neighboring ones of a plurality of extension lines. A process of forming pad portions connected to the plurality of extension line portions can be simplified. Thus, a semiconductor device having a relatively high integration density and/or improved electrical characteristics can be implemented.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor device comprising:
a substrate having a cell region and a connection region adjacent to the cell region;
a plurality of extension lines in the connection region and sequentially stacked on the substrate;
a plurality of gate electrodes in the cell region and sequentially stacked on the substrate;
a plurality of insulating layers between the plurality of extension lines and between the plurality of gate electrodes; and
a channel structure in a channel hole passing through the plurality of gate electrodes and the plurality of insulating layers, the channel hole including a lower channel hole and an upper channel hole communicatively connected to the lower channel hole underneath,
wherein each of the plurality of gate electrodes is connected to a corresponding one of the plurality of extension lines,
first distances between pairs of two neighboring ones of the plurality of extension lines are substantially equal to each other, and
the plurality of insulating layers include a first insulating layer between the plurality of gate electrodes adjacent to a boundary between the lower channel hole and the upper channel hole in the cell region, the first insulating layer having a thickness greater than each of the first distance, and wherein
the plurality of extension lines comprise a dummy extension line adjacent to the boundary,
the plurality of insulating layers comprise a dummy insulating layer under the dummy extension line, and
a top surface of the dummy extension line is substantially coplanar with the boundary.

2. The semiconductor device of claim 1, wherein a second distance between a pair of two neighboring ones of the plurality of gate electrodes adjacent to the boundary is greater than each of the first distances.

3. The semiconductor device of claim 1, wherein at least one of the dummy extension line and the dummy insulating layer is in contact with a side surface of the first insulating layer.

4. The semiconductor device of claim 1, wherein a portion of the dummy insulating layer is between the first insulating layer and the dummy extension line.

5. A semiconductor device comprising:
a substrate having a cell region and a connection region adjacent to the cell region;
a lower stack structure including a plurality of lower insulating layers and a plurality of lower conductive layers, the plurality of lower insulating layers and the plurality of lower conductive layers being alternately stacked on each other on the substrate, each of the plurality of lower conductive layers including,
a lower gate electrode portion in the cell region, and
a lower extension line portion in the connection region, the lower extension line portion extending from the lower gate electrode portion;
an upper stack structure including a plurality of upper insulating layers and a plurality of upper conductive layers, the plurality of upper insulating layers and the plurality of upper conductive layers alternately stacked on each other on the lower stack structure, each of the plurality of upper conductive layers including,
an upper gate electrode portion in the cell region, and
an upper extension line portion in the connection region, the upper extension line portion extending from the upper gate electrode portion;
a channel structure passing through the upper stack structure and the lower stack structure; and
at least one middle spacer structure in the connection region, the middle spacer structure including a dummy conductive layer, the dummy conductive layer including at least one dummy extension line portion, the at least one dummy extension line portion being between the upper stack structure and the lower stack structure, the middle spacer structure being in contact with a side surface of at least one of the plurality of lower insulating layers or the plurality of upper insulating layers,
wherein a first distance between lower extension line portions of two neighboring ones of the plurality of lower conductive layers, a second distance between upper extension line portions of two neighboring ones of the plurality of upper conductive layers, a third distance between an uppermost surface of the plurality of lower conductive layers and a lowermost surface of the at least one dummy extension line portion, and a fourth distance between a lowermost surface of the plurality of upper conductive layers and an uppermost surface of the at least one dummy extension line portion are substantially equal to each other.

6. The semiconductor device of claim 5, wherein a fifth distance between the lower gate electrode portion included in an uppermost one of the plurality of lower conductive layers and the upper gate electrode portion included in a lowermost one of the plurality of upper conductive layers is greater than the first distance.

7. The semiconductor device of claim 5, wherein
the middle spacer structure further comprises a dummy insulating layer provided between the lower extension line portion included in an uppermost one of the plurality of lower conductive layers and the at least one dummy extension line portion, and
a thickness of the dummy insulating layer is substantially equal to the first distance.

8. The semiconductor device of claim 5, wherein the at least one middle spacer structure comprises:
a first middle spacer structure in contact with a side surface of an uppermost one of the plurality of lower insulating layers; and
a second middle spacer structure in contact with a side surface of a lowermost one of the plurality of upper insulating layers.

9. The semiconductor device of claim 8, wherein
the first middle spacer structure comprises a first dummy insulating layer and a first dummy conductive layer on the first dummy insulating layer,
the second middle spacer structure comprises a second dummy insulating layer and a second dummy conductive layer on the second dummy insulating layer, and
a thickness of each of the first dummy insulating layer and the second dummy insulating layer is substantially equal to the first distance.

10. A semiconductor device comprising:
a substrate having a cell region and a connection region adjacent to the cell region;
a plurality of extension lines in the connection region, the plurality of extension lines sequentially stacked on the substrate;
a plurality of gate electrodes in the cell region, the plurality of gate electrodes sequentially stacked on the substrate, the plurality of gate electrodes connected to corresponding ones of the plurality of extension lines, respectively, to form a plurality of conductive layers;
a plurality of insulating layers alternately between the plurality of conductive layers, first distances between pairs of two neighboring ones of the plurality of extension lines are substantially equal to each other, and at least one of distances between pairs of two neighboring ones of the plurality of gate electrodes is greater than each of the first distances; and
a channel structure passing through the plurality of gate electrodes,
wherein a stack structure comprises the plurality of conductive layers and the plurality of insulating layers, and the stack structure includes a lower channel hole and an upper channel hole communicatively connected to the lower channel hole underneath,
the plurality of extension lines comprise a dummy extension line disposed between the plurality of extension lines,
the plurality of insulating layers comprise a dummy insulating layer on a bottom surface of the dummy extension line, and
a top surface of the dummy extension line is substantially coplanar with a top surface of the lower channel hole.

11. The semiconductor device of claim 10, wherein
the channel structure is in the lower channel hole and the upper channel hole, and at least one of the plurality of insulating layers adjacent to a boundary between the lower channel hole and the upper channel hole has a thickness greater than each of the first distances.

12. The semiconductor device of claim 11, wherein a top surface of one of the plurality of extension lines is substantially coplanar with the boundary between the lower channel hole and the upper channel hole.

13. The semiconductor device of claim 11, wherein
the dummy extension line is adjacent to the boundary between the lower channel hole and the upper channel hole.

14. The semiconductor device of claim 10, further comprising:
a lower spacer in the connection region, the lower spacer being between a lowermost one of the plurality of insulating layers and the substrate, the lower spacer having the plurality of extension lines thereon.

* * * * *